United States Patent
Takizawa

(10) Patent No.: US 9,038,463 B2
(45) Date of Patent: May 26, 2015

(54) ELECTRONIC DEVICE, MANUFACTURING METHOD THEREOF, AND ELECTRONIC APPARATUS

(75) Inventor: Teruo Takizawa, Matsumoto (JP)

(73) Assignee: Seiko Epson Corporation (JP)

( * ) Notice: Subject to any disclaimer, the term of this patent is extended or adjusted under 35 U.S.C. 154(b) by 250 days.

(21) Appl. No.: 13/608,114

(22) Filed: Sep. 10, 2012

(65) Prior Publication Data

US 2013/0074596 A1   Mar. 28, 2013

(30) Foreign Application Priority Data

Sep. 22, 2011  (JP) ................. 2011-207262
Nov. 8, 2011   (JP) ................. 2011-244467
Nov. 8, 2011   (JP) ................. 2011-244468

(51) Int. Cl.
*G01P 3/44*   (2006.01)
*G01P 1/02*   (2006.01)
*B81B 7/00*   (2006.01)
*G01D 11/10*  (2006.01)

(52) U.S. Cl.
CPC ....... *B81B 7/0041* (2013.01); *B81B 2201/0242* (2013.01); *B81C 2203/0145* (2013.01)

(58) Field of Classification Search
USPC .................................................. 73/504.12
See application file for complete search history.

(56) References Cited

U.S. PATENT DOCUMENTS

| 6,497,148 B1* | 12/2002 | Abe et al. ............. 73/504.16 |
| 2009/0195125 A1* | 8/2009 | Matsugi .................. 310/348 |
| 2010/0102678 A1* | 4/2010 | Saita ....................... 310/344 |
| 2011/0133605 A1* | 6/2011 | Ishikawa et al. ........ 310/344 |

FOREIGN PATENT DOCUMENTS

| JP | 11-142430 | 5/1999 | |
| JP | 2002009577 | * 11/2002 | .............. H03H 9/10 |
| JP | 2005-064024 | 3/2005 | |

* cited by examiner

*Primary Examiner* — Eric S McCall
*Assistant Examiner* — Anthony W Megna Fuentes
(74) *Attorney, Agent, or Firm* — Harness, Dickey & Pierce, P.L.C.

(57) ABSTRACT

An electronic device includes a base body, a functional element that is placed on the base body, and a lid body, formed from silicon, that is placed over the base body so as to cover the functional element. A hole portion and a sealing member that closes the hole portion are disposed in the lid body, in the hole portion, the area of a second opening disposed on a side opposite to a first opening is larger than the area of the first opening disposed on the base body side, and the ratio of the volume of the sealing member to the volume of the hole portion is equal to or higher than 35% and is equal to or lower than 87%.

16 Claims, 17 Drawing Sheets

ELECTRONIC DEVICE, MANUFACTURING METHOD THEREOF, AND ELECTRONIC APPARATUS

BACKGROUND

1. Technical Field

The present invention relates to an electronic device, a manufacturing method thereof, and an electronic apparatus.

2. Related Art

Recently, electronic devices such as inertial sensors that detect physical quantities, for example, using a silicon micro electro mechanical system (MEMS) technique have been developed. Among such inertial sensors, a gyro sensor (angular velocity sensor) that detects angular velocity is used for a hand shaking correcting function of a digital camera (DSC), a motion sensing function of a game machine, and the like.

Generally, it is preferable that a vibration-type gyro sensor that vibrates a structure body and detects the Coriolis force is sealed in a vacuum environment. The reason for this is that the vibration-type gyro sensor constantly vibrates so as to detect the Coriolis force, and, in a case where air (or any other gas or the like) is present inside a package (cavity) that houses the vibration-type gyro sensor, the vibration phenomenon attenuates due to the air viscosity.

As examples of a technique for vacuum sealing the inside of the package, there is a technique using laser beams disclosed in JP-A-2005-64024 and the like. More specifically, in the technique disclosed in JP-A-2005-64024, a sphere-shaped sealing member is arranged inside a through hole of an upper package lid that is formed from silicon, and the inside of the through hole is filled by melting the sealing member using laser beams so as to vacuum-seal the inside of the package.

The silicon substrate, for example, can be processed more finely than a ceramics substrate or a crystal substrate, and can be appropriately used when a package that houses a functional element such as an inertial sensor is miniaturized. However, for example, in a case where a sealing member is arranged in a through hole (hole portion) of a package that is formed by processing a silicon substrate, and the sealing member is melted so as to close the through hole, there is a case where cracks occur on the periphery of the through hole in the package. Such cracks occur markedly in a case where a silicon substrate is used. When a package in which cracks occur is used, there are cases where the reliability of the electronic device whose package houses a functional element is degraded.

SUMMARY

An advantage of some aspects of the invention is that it provides an electronic device that has high reliability and a manufacturing method thereof. In addition, another advantage of some aspects of the invention is that it provides an electronic apparatus that includes the above-described electronic device.

APPLICATION EXAMPLE 1

This application example is directed to an electronic device including: a base body; a functional element that is placed on the base body; and a lid body, formed from silicon, that is placed over the base body so as to cover the functional element. A hole portion and a sealing member that closes the hole portion are disposed in the lid body, in the hole portion, the area of a second opening disposed on a side opposite to a first opening is larger than the area of the first opening disposed on the base body side, and a ratio of the volume of the sealing member to the volume of the hole portion is equal to or higher than 35% and is equal to or lower than 87%.

According to the electronic device, the hole portion can be closed by the sealing member, and the generation of crack in the lid body on the circumference of the hole portion can be suppressed. As a result, the electronic device can have high reliability.

APPLICATION EXAMPLE 2

The electronic device according to the above application example may be configured such that the ratio of the volume of the sealing member to the volume of the hole portion is equal to or higher than 35% and equal to or lower than 58%.

According to the electronic device, for example, when the sealing member is melted by using energy beams such as laser beams, the hole portion can be closed more reliably by the sealing member, and the generation of crack in the lid body on the circumference of the hole portion can be suppressed, regardless of the power of the energy beams.

APPLICATION EXAMPLE 3

The electronic device according to the above application example may be configured such that a shape of the first opening is a polygon.

According to the electronic device, for example, a gap can be arranged between the sealing member and the side face of the hole portion in the state in which the sphere-shaped sealing member is arranged inside the hole portion. Therefore, the sealing member is suppressed from jumping out when the inside of the cavity in which the functional element is housed is formed to be in a decompressed state. For example, in a case where the gap is not arranged in a state in which the sphere-shaped sealing member is arranged inside the hole portion, there are cases where the sealing member jumps out of the package depending on a pressure difference between the inside and the outside of the package.

APPLICATION EXAMPLE 4

The electronic device according to the above application example may be configured such that a corner portion of the second opening is not filled with the sealing member.

According to the electronic device, it is difficult for crack to be generated from the corner portion of the second opening, and an electronic device having superior airtightness can be realized.

APPLICATION EXAMPLE 5

The electronic device according to the above application example maybe configured such that the functional element is arranged at a position not overlapping the first opening in a plan view.

According to the electronic device, when the sealing member is melted by the emission of energy beams such as laser beams, even in a case where apart of the sealing member scatters in the cavity, the scattered sealing member can be suppressed from being attached to the functional element. In addition, when the energy beams pass through the sealing member, there is no functional element right below the hole portion, and accordingly, the functional element can be prevented from being damaged.

APPLICATION EXAMPLE 6

The electronic device according to the above application example may be configured such that a metal layer is disposed on a side face of the hole portion, and a material of the sealing member is an alloy that contains an element included in the metal layer.

According to the electronic device, when the sealing member is melted, the melted sealing member adheres along the side face of the hole portion, whereby an electronic device having high air-tightness can be realized.

APPLICATION EXAMPLE 7

The electronic device according to the above application example may be configured such that the base body is formed from glass, and the functional element is a gyro sensor using silicon.

According to the electronic device, the base body and the functional element, and the base body and the lid body can be easily bonded to each other using anodic bonding. In addition, in a case where the gyro sensor is formed by silicon MEMS processing, when the base body is formed from silicon, for example, the insulating film needs to be interposed so as to maintain an insulating property between the gyro sensor and the base body. However, by forming the base body from glass, the insulating film does not need to be interposed, and insulating separation can be easily performed.

APPLICATION EXAMPLE 8

The electronic device according to the above application example maybe configured such that the electronic device further includes a cavity that houses the functional element and is surrounded by the base body and the lid body, and the hole portion includes a bottom face and communicates with the cavity through a communication hole that is disposed in a part of the bottom face, and, when an opening area of the second opening of the hole portion is S1, an opening area of the first opening of the communication hole is S2, an opening area of the communication hole on the cavity side is S3, and an area of the bottom face of the hole portion is S4, relation of "S2<S3<S4<S1" is satisfied.

According to the electronic device, when the cavity is sealed by melting the sealing member that is disposed in the hole portion, it can be suppressed that apart of the sealing member scatters inside the cavity and is attached to the functional element. As a result, the electronic device can have excellent characteristics.

APPLICATION EXAMPLE 9

The electronic device according to the above application example may be configured such that the bottom face of the hole portion is flat.

According to the electronic device, for example, a gap can be arranged between the sealing member and the bottom face of the hole portion in the state in which the sphere-shaped sealing member is arranged inside the hole portion. Therefore, the sealing member is suppressed from jumping out when the inside of the cavity is formed to be in a decompressed state. For example, in a case where the gap is not arranged in a state in which the sphere-shaped sealing member is arranged inside the hole portion, there are cases where the sealing member jumps out of the package depending on a pressure difference between the inside and the outside of the package.

APPLICATION EXAMPLE 10

The electronic device according to the above application example may be configured such that a shape of the second opening of the hole portion, the first opening of the communication hole, and an opening of the communication hole on the cavity side are a polygon.

According to the electronic device, excellent characteristics can be provided.

APPLICATION EXAMPLE 11

The electronic device according to the above application example maybe configured such that the functional element is arranged so as not to overlap the opening of the communication hole on the cavity side in a plan view.

According to the electronic device, even when the sealing member scatters into the cavity, the scattering sealing member can be suppressed from being attached to the functional element.

APPLICATION EXAMPLE 12

The electronic device according to the above application example may be configured such that the lid body is placed in the base body and includes the hole portion disposed on one face side and a cavity disposed on the other face side, the functional element is housed in the cavity, and the hole portion includes a bottom face, includes the second opening that has a polygonal shape in a plan view, and communicates with the cavity through the first opening that is disposed in a part of the bottom face of the hole portion.

According to the electronic device, when the cavity is sealed by melting the sealing member that is disposed in the hole portion, it can be suppressed that apart of the sealing member scatters inside the cavity and is attached to the functional element. As a result, the electronic device can have excellent characteristics.

APPLICATION EXAMPLE 13

The electronic device according to the above application example may be configured such that the bottom face of the hole portion is flat.

According to the electronic device, for example, a gap can be arranged between the sealing member and the bottom face of the hole portion in the state in which the sphere-shaped sealing member is arranged inside the hole portion. Therefore, the sealing member is suppressed from jumping out when the inside of the cavity is formed to be in a decompressed state. For example, in a case where the gap is not arranged in a state in which the sphere-shaped sealing member is arranged inside the hole portion, there are cases where the sealing member jumps out of the package depending on a pressure difference between the inside and the outside of the package.

APPLICATION EXAMPLE 14

The electronic device according to the above application example may be configured such that the area of the first opening is smaller than the area of the second opening.

According to the electronic device, even when the sealing member scatters into the cavity, the scattering sealing member can be suppressed from being attached to the functional element.

APPLICATION EXAMPLE 15

The electronic device according to the above application example may be configured such that the first opening does not overlap the functional element in a plan view.

According to the electronic device, even when the sealing member scatters into the cavity, the scattering sealing member can be suppressed from being attached to the functional element.

APPLICATION EXAMPLE 16

This application example is directed to a method of manufacturing an electronic device, the method including: placing a functional element on a base body; forming a hole portion in a lid body that is formed from silicon; housing the functional element by placing the lid body on the base body; arranging a sealing member in the hole portion; and closing the hole portion by melting the sealing member with energy beams. The hole portion is formed such that the area of a second opening disposed on a side opposite to a first opening is larger than the area of the first opening disposed on the base body side, and a ratio of the volume of the sealing member to the volume of the hole portion is equal to or higher than 35% and is equal to or lower than 87%.

According to the method of manufacturing an electronic device, the hole portion can be closed by the sealing member, and the generation of crack in the lid body on the circumference of the hole portion can be suppressed. As a result, the electronic device having high reliability can be formed.

APPLICATION EXAMPLE 17

The method of manufacturing an electronic device according to the above application example may be configured such that, in the closing of the hole portion, the sealing member is melt after an atmosphere of the functional element side is decompressed through the hole portion.

According to the above-described method of manufacturing an electronic device, the cavity can be sealed in the decompressed state, and a decrease in the accuracy due to the attenuation of vibration of the functional element (more specifically, the gyro sensor) that is caused by the air viscosity can be suppressed.

APPLICATION EXAMPLE 18

This application example is directed to an electronic apparatus that includes the above-described electronic device.

According to the above-described electronic apparatus, the above-described electronic device is included, and accordingly, high reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
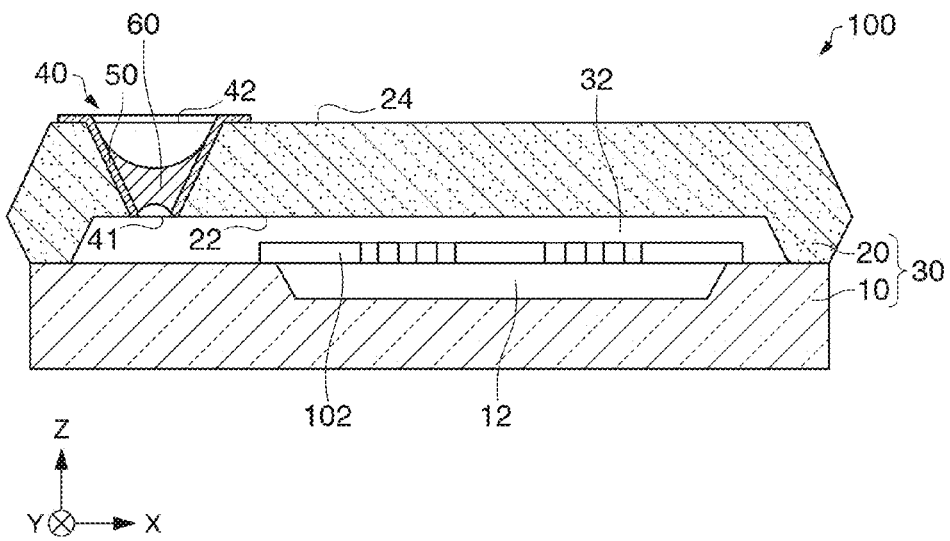
FIG. 1 is a cross-sectional view that schematically illustrates an electronic device according to a first embodiment.
Figure 2:
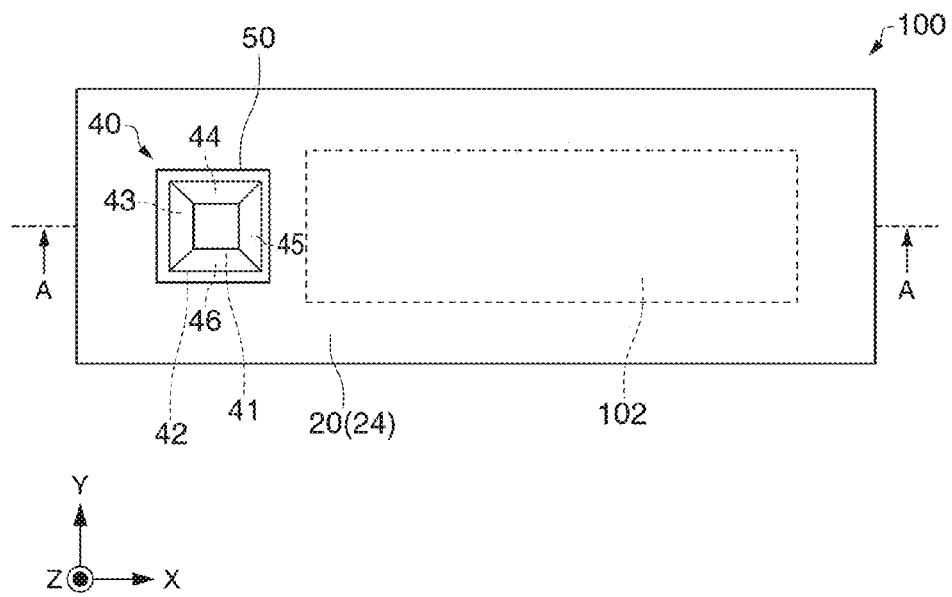
FIG. 2 is a plan view that schematically illustrates the electronic device according to the first embodiment.
Figure 3:
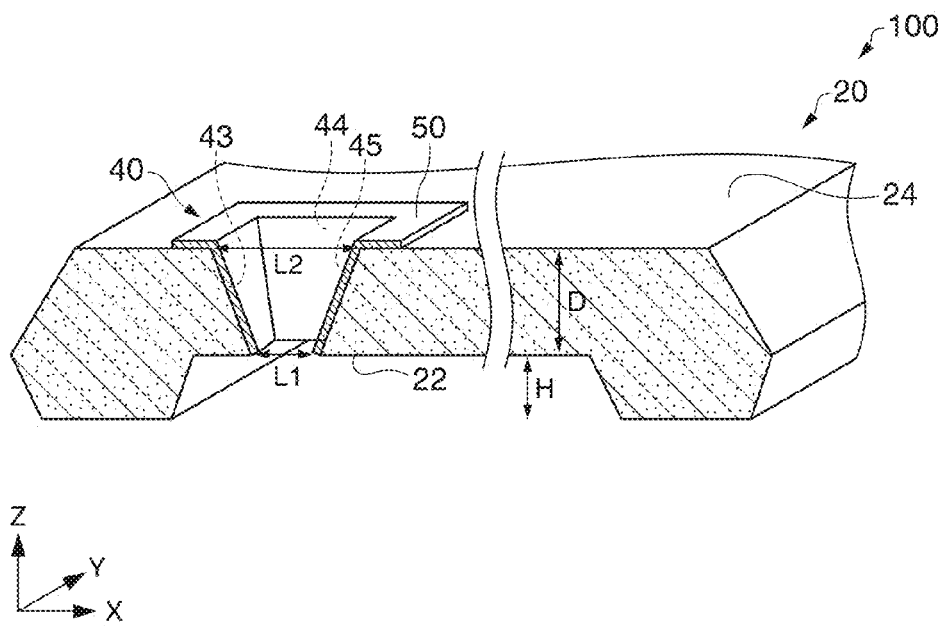
FIG. 3 is a cross-sectional perspective view that schematically illustrates a lid body of the electronic device according to the first embodiment.

Hereinafter, preferred embodiments of the invention will be described with reference to the accompanying drawings.
1. Electronic Device
First Embodiment First, an electronic device according to a first embodiment will be described with reference to the drawings. FIG. 1 is a cross-sectional view that schematically illustrates the electronic device 100 according to the first embodiment. FIG. 2 is a plan view that schematically illustrates the electronic device 100 according to the first embodiment. FIG. 3 is a cross-sectional perspective view that schematically illustrates the electronic device 100 according to the first embodiment. FIG. 1 is a cross-sectional view of FIG. 2 taken along line A-A, and FIG. 3 is a cross-sectional perspective view of FIG. 2 taken along line A-A.

The electronic device 100, as shown in FIGS. 1 to 3, includes a package 30 that includes a base body 10 and a lid body 20, a sealing member 60, and a functional element 102. The electronic device 100 may further include a metal layer 50. For the convenience of description, the functional element 102 is illustrated in a simplified manner in FIGS. 1 and 2. In addition, in FIGS. 2 and 3, the sealing member 60 is not illustrated. Furthermore, in FIG. 3, members other than the lid body 20 and the metal layer 50 are not illustrated.

As the base body 10, for example, a glass substrate, a silicon substrate, a quartz crystal substrate may be used. The base body 10 can support the functional element 102. In the base body 10, for example, a concave portion 12 is formed, and the functional element 102 is arranged on the upper side of the concave portion 12. Owing to the concave portion 12, the functional element 102 can be moved only in a predetermined direction without intervening with the base body 10.

The lid body 20 is placed on the base body 10 so as to cover the functional element 102. The lid body 20 may be bonded to the base body 10. In some cases, the lid body 20 may be bonded to a part of the functional element 102. As the lid body 20, a silicon substrate is used. In a case where a glass substrate is used as the base body 10, the base body 10 and the lid body 20 may be bonded to each other through anodic bonding.

In addition, the method of bonding the base body 10 and the lid body 20 is not particularly limited but, for example, may be a bonding method using low-melting point glass (glass paste) or a bonding method using soldering. Alternatively, the base body 10 and the lid body 20 may be bonded to each other by forming metal thin films (not shown in the figure) in bonding portions of the base body 10 and the lid body 20 and bonding the metal thin films to each other through eutectic bonding.

The base body 10 and the lid body 20 form a cavity 32 that houses the functional element 102. In the illustrated example, a concave portion is formed in the lid body 20, and the concave portion is sealed by the base body 10 so as to be formed as the cavity 32. The planar shape of the base body 10 and the lid body 20 (the shape viewed in the Z-axis direction) is not particularly limited, as long as the functional element 102 can be housed in the cavity 32. In the example shown in FIG. 2, the planar shape is a rectangle (more particularly, an oblong).

The cavity 32 is sealed to be in a decompressed state or at the atmosphere of inert gas (for example, nitrogen gas). Particularly, in a case where a gyro sensor is used as the functional element 102, it is preferable that the cavity 32 is in the decompressed state (more preferably, in a vacuum state). In such a case, the attenuation of the vibration of the gyro sensor due to the air viscosity can be suppressed.

In addition, in the example shown in the figure, although the concave portion that becomes the cavity 32 is formed in the lid body 20, the concave portion may be formed in the base body 10. Furthermore, the cavity 32 may be formed by housing the functional element 102 in the concave portion 12 formed in the base body 10 and sealing the concave portion 12 with the lid body 20.

In the lid body 20, a hole portion (through hole) 40 is formed. The hole portion 40 communicates with the cavity 32. In the example shown in the figure, the hole portion 40 passes through the lid body 20 in the Z-axis direction. The hole portion 40 has such a shape that the area of a second opening 42 disposed on a side opposite to a first opening 41 is larger than the area of the first opening 41 disposed on the cavity 32 side (in other words, the base body 10 side). The first opening 41 is an opening that is disposed on a first face 22 of the lid body 20 that partitions the cavity 32. The second opening 42 is an opening that is disposed on a second face 24 that is a face disposed on a side opposite to the first face 22 of the lid body 20 and forms the outer shape of the package 30. As shown in FIG. 2, in the plan view (when viewed in the Z-axis direction), the first opening 41 is arranged on an inner side of the outer circumference of the second opening 42. The hole portion 40 has such a shape that the area of the opening gradually increases from the first opening 41 toward the second opening 42.

The shape of the first opening 41, as shown in FIG. 2, is a polygon. In the example shown in the figure, the shape of the first opening 41 is a rectangle (more specifically, a square). The shape of the second opening 42 is not particularly limited, but, for example, may be a circle. In the example shown in the figure, the shape of the second opening 42 is a rectangle (more specifically, a square), which is the same as that of the first opening 41. The first opening 41, as shown in FIG. 2, is arranged at a position not overlapping the functional element 102 in the plan view. In other words, the first opening 41 is arranged on the outer side of the outer circumference of the functional element 102.

The side face (the face of the lid body 20 that partitions the hole portion 40) of the hole portion 40, for example, is configured by four flat faces 43, 44, 45, and 46. In a case where the hole portion 40 is formed by performing wet-etching of the lid body 20 that is formed by a silicon substrate of plane (100), the flat faces 43, 44, 45, and 46 have a crystal plane of plane (111). In such a case, the flat faces 43, 44, 45, and 46 are formed so as to be inclined with respect to the first face 22 of the lid body 20 by a predetermined angle (about 54.7°).

As shown in FIG. 3, the opening diameter L1 of the first opening 41, for example, is about 100 μm. The opening diameter L2 of the second opening 42, for example, is about 426 μm. A distance D between the first face 22 and the second face 24 of the lid body 20, for example, is about 230 μm. The depth H of the concave portion 32a of the lid body 20 that becomes the cavity 32, for example, is about 50 μm. Here, the opening diameter L1, for example, is a distance between a side that is a bonding portion of the flat face 43 and the first face 22 and a side that is a bonding portion of the flat face 45 and the first face 22. In addition, the opening diameter L2, for example, is a distance between a side that is a bonding portion of the flat face 43 and the second face 24 and a side that is a bonding portion of the flat face 45 and the second face 24.

The metal layer 50, as shown in FIGS. 1 and 3, is formed on the side face of the hole portion 40. As the metal layer 50, for example, a layer acquired by stacking a chromium layer and a gold layer in the mentioned order from the side face side of the hole portion 40 may be used. By the metal layer 50, the adhesiveness between the side face of the hole portion 40 and the sealing member 60 can be improved.

In addition, the material of the metal layer 50 may be appropriately changed in accordance with the material of the sealing member 60. In addition, although not shown in the figure, the metal layer 50 may be formed on the whole front face of the lid body 20 other than the side face of the hole portion 40.

The sealing member 60 is arranged in the hole portion 40 and closes the hole portion 40. The cavity 32 can be sealed by the sealing member 60. In the example shown in FIG. 1, the sealing member 60 does not cover the corner portion of the second opening 42. In other words, the corner portion of the second opening 42 is not filled with the sealing member 60. The material of the sealing member 60, for example, is an alloy that contains an element that is contained in the metal layer 50. More specifically, the material of the sealing member 60 is an alloy such as AuGe, AuSi, AuSn, SnPb, PbAg, SnAgCu, or SnZnBi.

The ratio of the volume of the sealing member 60 to the volume of the hole portion 40 is 35% or more and 87% or less, and is more preferably 35% or more and is 58% or less. Accordingly, the hole portion 40 can be closed by the sealing member 60 without the generation of crack in the lid body 20 on the circumference of the hole portion 40 (to be described later in detail).

In addition, in the above-described example, although an example has been described in which the hole portion 40 is formed in the lid body 20, the hole portion 40 may be formed in the base body 10. In such a case, a silicon substrate may be used as the base body 10.

The functional element 102 is placed (mounted) on the base body 10. The functional element 102, for example, may be bonded to the base body 10 through anodic bonding or direct bonding. The form of the functional element 102 is not particularly limited, as long as the functional element 102 operates inside the closed cavity 32 in the decompressed state or at the atmosphere of inert gas. Thus, for example, any of various functional elements such as a gyro sensor, an acceleration sensor, a vibrator, a surface acoustic wave (SAW), and a micro actuator may be used.

Second Embodiment

Figure 4A:
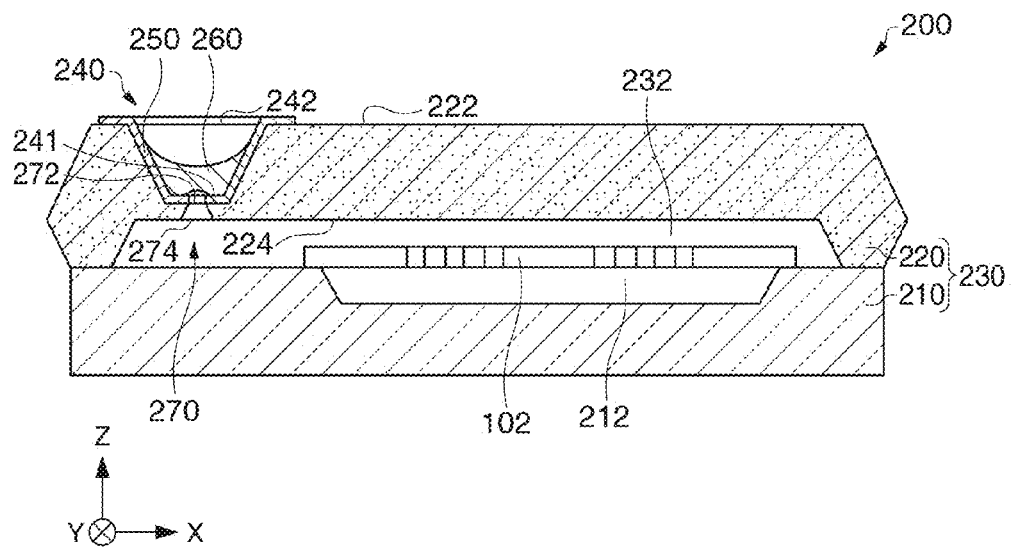
FIGS. 4A and 4B are cross-sectional views that schematically illustrate an electronic device according to a second embodiment.
Figure 4B:
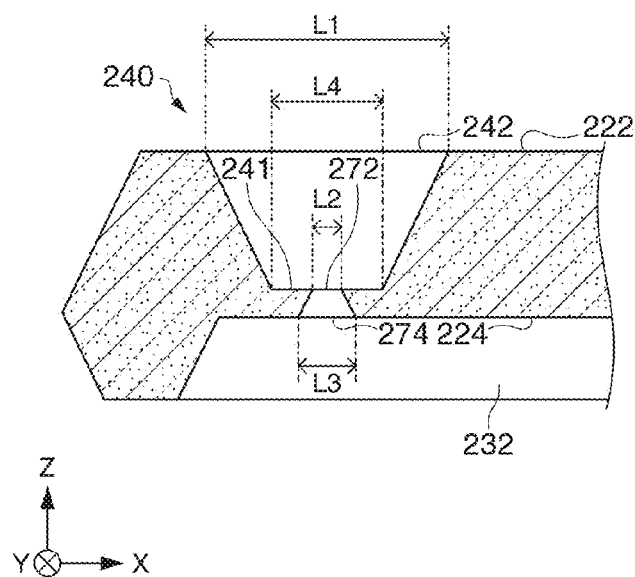
Figure 5:
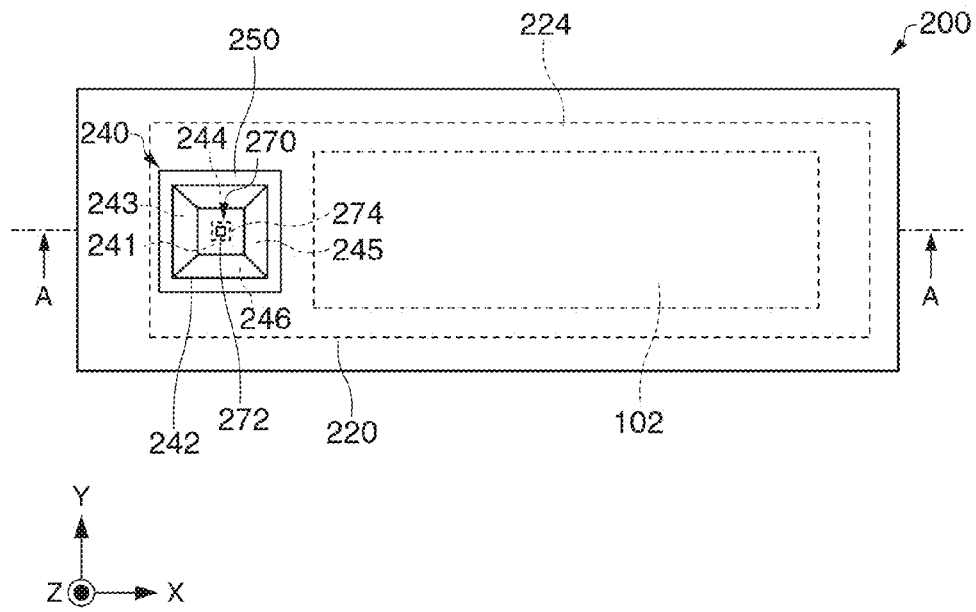
FIG. 5 is a plan view that schematically illustrates the electronic device according to the second embodiment.
Figure 6:
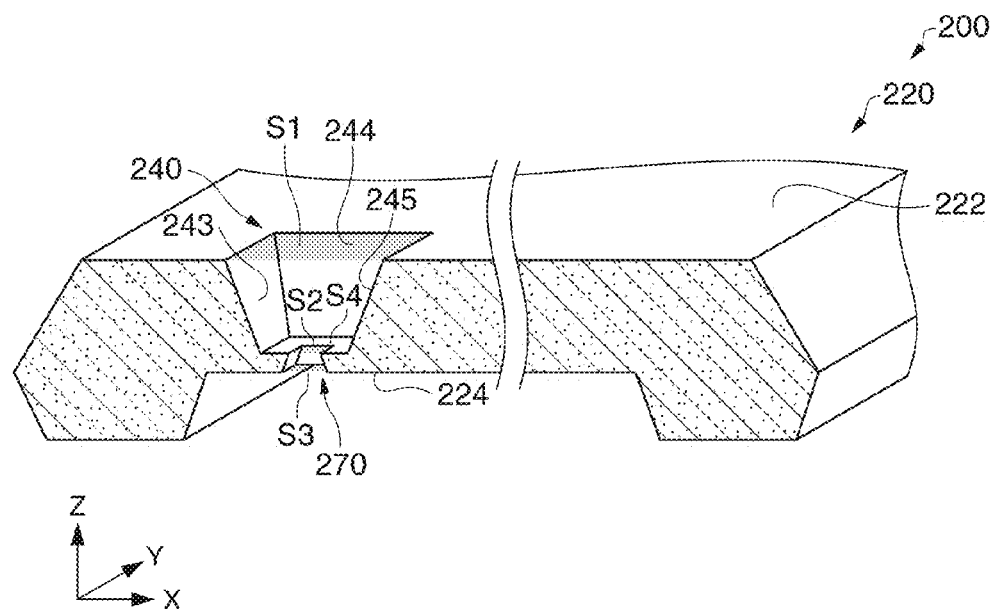
FIG. 6 is a cross-sectional perspective view that schematically illustrates a lid body of the electronic device according to the second embodiment.

Next, an electronic device according to a second embodiment will be described with reference to the drawings. FIGS. 4A and 4B are cross-sectional views that schematically illustrate the electronic device 200 according to the second embodiment. FIG. 5 is a plan view that schematically illustrates the electronic device 200 according to the second embodiment. FIG. 6 is a cross-sectional perspective view that schematically illustrates the electronic device 200 according to the second embodiment. FIG. 4A is a cross-sectional view taken along line A-A shown in FIG. 5, and FIG. 4B is a partially enlarged diagram of FIG. 4A. In addition, FIG. 6 is a cross-sectional perspective view taken along line A-A shown in FIG. 5. For the convenience of description, in FIGS. 4A to 6, the X axis, the Y axis, and the Z axis are represented as three axes that are perpendicular to one another.

The electronic device 200, as shown in FIGS. 4A to 6, includes a package 230 that includes a base body 210 and a lid body 220, a sealing member 260, and a functional element 102. The electronic device 200 may further include a metal layer 250. For the convenience of description, the functional element 102 is illustrated in a simplified manner in FIGS. 4A and 5. In addition, in FIGS. 4B, 5, and 6, the sealing member 260 is not illustrated. Furthermore, in FIG. 6, members other than the lid body 220 are not illustrated.

As the base body 210, for example, a glass substrate, a silicon substrate, a quartz crystal substrate may be used. The base body 210 supports the functional element 102. More specifically, in the base body 210, a concave portion 212 is formed, and the functional element 102 is arranged on the upper side of the concave portion 212. Owing to the concave portion 212, the functional element 102 can be moved only in a predetermined direction without intervening with the base body 210.

The lid body 220 is placed on the base body 210. The lid body 220 may be bonded to the base body 210. In some cases, the lid body 220 may be bonded to a part of the functional element 102. As the lid body 220, a silicon substrate (a substrate formed from silicon) is used. In a case where a glass substrate is used as the base body 210, the base body 210 and the lid body 220 may be bonded to each other through anodic bonding.

In addition, the method of bonding the base body 210 and the lid body 220 is not particularly limited but, for example, may be a bonding method using an adhesive such as low-melting point glass (glass paste) or a bonding method using soldering. Alternatively, the base body 210 and the lid body 220 may be bonded to each other by forming metal thin films (not shown in the figure) in bonding portions of the base body 210 and the lid body 220 and heating the metal thin films to be bonded to each other through eutectic bonding.

The base body 210 and the lid body 220 form a cavity 232 that houses the functional element 102. In the illustrated example, a concave portion is formed in the lid body 220, and the concave portion is sealed by the base body 210 so as to be formed as the cavity 232. The planar shape of the base body 210 and the lid body 220 (the shape viewed in the Z-axis direction) is not particularly limited, as long as the functional element 102 can be housed in the cavity 232. The planar shape of the base body 210 and the lid body 220, for example, is a rectangle (more particularly, an oblong).

The cavity 232 is sealed to be in a decompressed state or at the atmosphere of inert gas (for example, nitrogen gas). Particularly, in a case where a vibration-type gyro sensor is used as the functional element 102, it is preferable that the cavity 232 is in the decompressed state. In such a case, the attenuation of the vibration phenomenon of the vibration-type gyro sensor due to the air viscosity can be suppressed.

In addition, in the example shown in the figure, although the concave portion that becomes the cavity 232 is formed in the lid body 220, it may be formed in the base body 210, and the cavity 232 may be formed by sealing the concave portion formed in the base body 210 with the lid body 220.

On a second face 222 of the lid body 220, a hole portion 240 is formed. The hole portion 240 includes a second opening 242 that is disposed in the second face 222 of the lid body 220. The second face 222 of the lid body 220 is the front face of the lid body 220 and is a face that forms the outer shape of the package 230. The second face 222 of the lid body 220 is a face that is disposed on a side opposite to the first face 224 of the lid body 220. The first face 224 of the lid body 220 is a face that defines the cavity 232 (the bottom of the concave portion that becomes the cavity).

The hole portion 240 includes a bottom face 241 and has such a shape that the cross-sectional area (an area in the XY plane) gradually increases from the bottom face 241 toward the second opening 242. In other words, the area of the second opening 242 is larger than that of the bottom face 241. The bottom face 241 of the hole portion 240 may be regarded as a face of the lid body 220 that defines the bottom of the hole portion 240. The bottom face 241 of the hole portion 240, for example, is flat. In the example shown in the figure, the bottom face 241 of the hole portion 240 is parallel to the second face 222 of the lid body 220.

The hole portion 240 communicates with the cavity 232 through a communication hole 270 that is formed in the lid body 220. The communication hole 270 includes a first opening 272 that is disposed in a part of the bottom face 241 of the hole portion 240 and a third opening 274 that is disposed on the cavity 232 side. The first opening 272 is disposed in the bottom face 241 that is located on the hole portion 240 side and is the same opening as that disposed on the bottom face 241 that is located on the communication hole 270 side.

The third opening 274 is disposed in the first face 224 of the lid body 220. In addition, the third opening 274, as shown in FIG. 5, is not arranged at a position overlapping the functional element 102 in the plan view. In other words, the third opening 274 is arranged on the outer side of the outer edge of the functional element 102. The communication hole 270 has a shape in which the cross-sectional area (the area in the XY plane) gradually increases from the first opening 272 toward the third opening 274. In other words, the area of the third opening 274 is larger than that of the first opening 272.

The shape of the second opening 242 of the hole portion 240, as shown in FIG. 5, is a polygon. In the example shown in the figure, the shape of the second opening 242 is a rectangle (more specifically, a square). The shape of the bottom face 241 of the hole portion 240, for example, is a polygon and, in the example shown in the figure, similarly to the second opening 242, is a rectangle (more specifically, a square). In addition, the shape of the first opening 272 of the communication hole 270 and the shape of the third opening 274, for example, are polygons. In the example shown in the figure, the shape of the first opening 272 and the shape of the third opening 274, for example, are rectangles (more specifically, a square). The center of the second opening 242, the center of the first opening 272, and the center of the third opening 274, for example, are located on a predetermined axis (not shown in the figure) that extends along the Z axis. The center of the second opening 242, the center of the first opening 272, and the center of the third opening 274 may not be located on the same axis. In addition, the second opening 242, the first opening 272, the third opening 274, and the bottom face 241 are included in the first face 224 of the lid body 220 in the plan view.

As shown in FIG. 4B, a length L1 of the second opening 242 of the hole portion 240 along the X axis, a length L2 of the first opening 272 of the communication hole 270 along the X-axis, a length L3 of the third opening 274 of the communication hole 270 along the X axis, and a length L4 of the bottom face 241 of the hole portion 240 along the X axis have the relation of "L2<L3<L4<L1". In addition, lengths of the second opening 242, the first opening 272, and the third opening 274 along the Y-axis and a length of the bottom face 241 along the Y axis have relation similar thereto. Accordingly, the area S1 of the second opening 242, the area S2 of the first opening 272, the area S3 of the third opening 274, and the area S4 of the bottom face 241 shown in FIG. 6 have the relation of "S2<S3<S4<S1".

The length L1 of the second opening 242 of the hole portion 240 along the X axis, for example, is about 426 μm (area of 181,476 μm$^2$). In addition, the length L2 of the first opening 272 of the communication hole 270 along the X axis, for example, is about 10 μm (area of 100 μm$^2$). The length L3 of the third opening 274 of the communication hole 270 along the X axis, for example, is about 15 μm (area of 225 μm$^2$). In addition, the length L4 of the bottom face 241 of the hole portion 240 along the X axis, for example, is 100 μm (area of 10,000 μm$^2$).

The side face (the face of the lid body 220 that defines the side face of the hole portion 240) of the hole portion 240, for example, is configured by four flat faces 243, 244, 245, and 246. In a case where the hole portion 240 is formed by performing wet-etching of the lid body 220 that is formed by a silicon substrate of plane (100), the flat faces 243, 244, 245, and 246 have a plane (111). In such a case, the flat faces 243, 244, 245, and 246 are formed so as to be inclined with respect to the first face 224 (the bottom face 241 of the hole portion 240) of the lid body 220 by a predetermined angle (about 54.7°).

In addition, the side face (the face of the lid body 220 that defines the side face of the communication hole 270) of the communication hole 270, for example, is configured by four flat faces, similarly to the hole portion 240. In a case where the communication hole 270 is formed by performing wet-etching of the lid body 220 that is formed by a silicon substrate of plane (100), the flat faces are of plane (111). In such a case, the flat faces are formed so as to be inclined with respect to the second face 222 (the bottom face 241 of the hole portion 240) of the lid body 220 by a predetermined angle (about 54.7°).

The metal layer 250, as shown in FIGS. 4A and 4B and 5, is formed on the side face (the flat faces 243, 244, 245, and 246) and the bottom face 241 of the hole portion 240. As the metal layer 250, for example, a layer acquired by stacking a chromium layer and a gold layer in the mentioned order from the inner face side of the hole portion 240 may be used. By the metal layer 250, the adhesiveness between the side face (the flat faces 243, 244, 245, and 246) and the bottom face 241 of the hole portion 240 and the sealing member 260 can be improved. The thickness of the metal layer 250 is not particularly limited but, for example, is in the range of about 30 to 100 nm.

In addition, the material of the metal layer 250 may be appropriately changed in accordance with the material of the sealing member 260. In addition, although not shown in the figure, the metal layer 250 may be formed on the whole face of the lid body 220.

The sealing member 260 is arranged in the hole portion 240 and seals the cavity 232. The material of the sealing member 260 is an alloy such as AuGe, AuSi, AuSn, SnPb, PbAg, SnAgCu, or SnZnBi.

The functional element 102 is placed (mounted) on the base body 210. The functional element 102 is placed (housed) in a cavity 232 that is formed (surrounded by the base body 210 and the lid body 220) by the base body 210 and the lid body 220. The functional element 102, for example, may be bonded to the base body 210 through anodic bonding or direct bonding or may be bonded using an adhesive. The form of the functional element 102 is not particularly limited, as long as the functional element 102 operates inside the closed cavity 232 in the decompressed state or at the atmosphere of inert gas. Thus, for example, any of various functional elements such as a gyro sensor, an acceleration sensor, a vibrator, a surface acoustic wave (SAW) element, and a micro actuator may be used.

Modified Example of Second Embodiment

Figure 7:
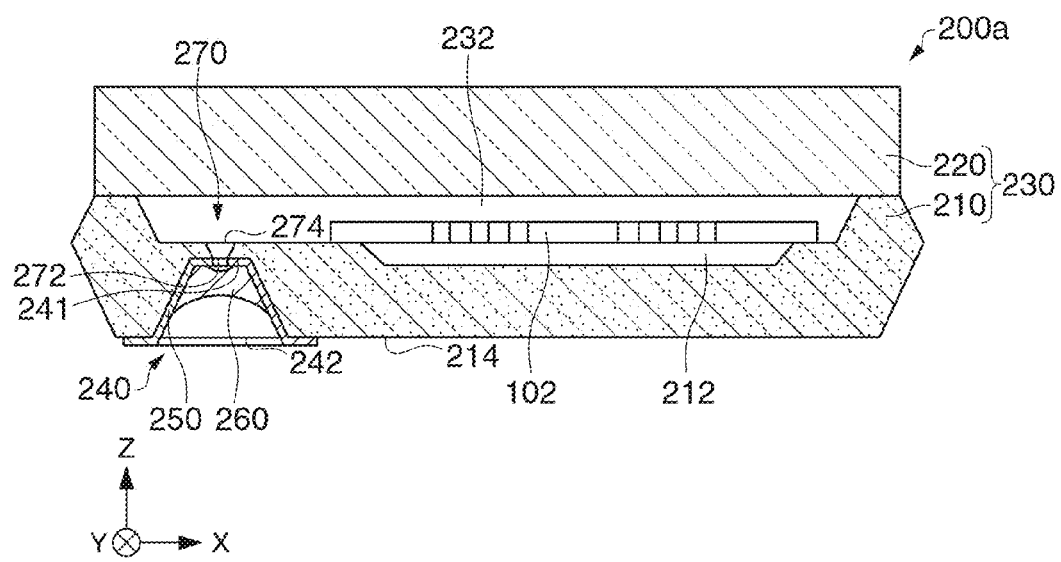
FIG. 7 is a cross-sectional view that schematically illustrates an electronic device according to a modified example of the second embodiment.
Figure 8:
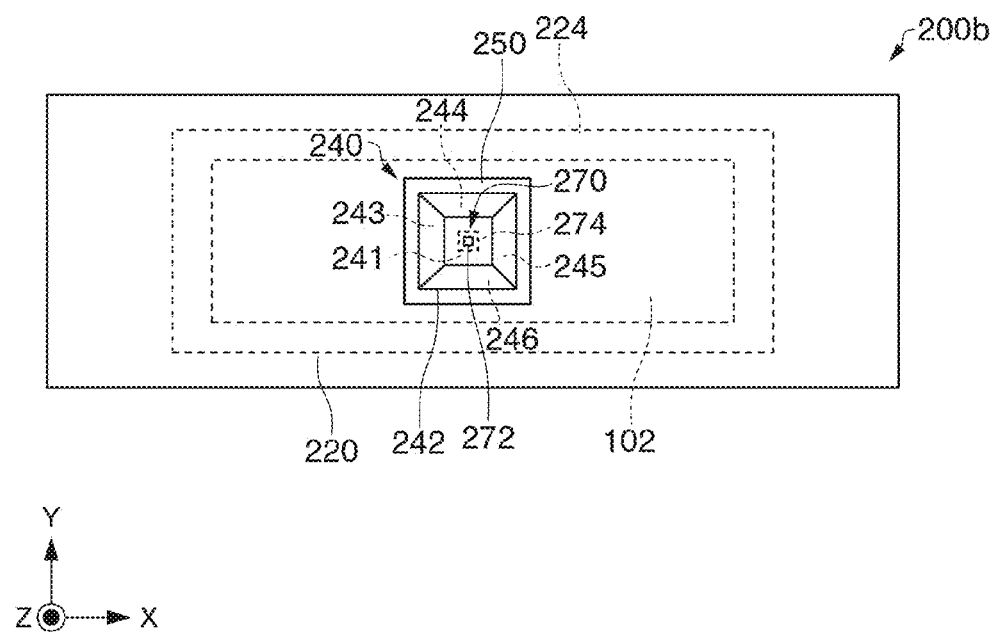
FIG. 8 is a plan view that schematically illustrates an electronic device according to a modified example of the second embodiment.

Next, an electronic device according to a modified example of the second embodiment will be described with reference to the drawings. FIG. 7 is a cross-sectional view that schematically illustrates the electronic device 200a according to the modified example of the second embodiment and corresponds to FIG. 4A. Hereinafter, the same reference numeral is assigned to each member of the electronic device 200a according to the modified example of the second embodiment that has the same function as a constituent member of the electronic device 200 according to the second embodiment, and detailed description thereof will not be presented.

In the example of the electronic device 200, as shown in FIGS. 4A and 4B, the hole portion 240 and the communication hole 270 are formed in the lid body 220. In contrast to this, in the electronic device 200a, as shown in FIG. 7, the hole portion 240 and the communication hole 270 are formed in the base body 210.

In the electronic device 200a, a silicon substrate maybe used as the base body 210. By using the silicon substrate as the base body 210, a processing technique used for manufacturing a silicon semiconductor device can be applied to forming the hole portion 240 and the communication hole 270 in the base body 210. As a result, the hole portion 240 and the communication hole 270 can be formed with fine and high precision. As the lid body 220, for example, a glass substrate, a silicon substrate, or a quartz crystal substrate maybe used.

In the electronic device 200a, the second opening 242 of the hole portion 240 is disposed in a third face 214 of the base body 210. The third face 214 of the base body 210 is a front face of the base body 210 and is a face that forms the outer shape of the package 230. The communication hole 270 includes the first opening 272 that is disposed in a part of the bottom face 241 of the hole portion 240. The bottom face 241 of the hole portion 240 may be regarded as a face of the base body 210 that defines the bottom of the hole portion 240. In addition, in the electronic device 200a, a concave portion that becomes the cavity 232 is formed in the base body 210.

As a method of manufacturing the electronic device 200a, a method of manufacturing the electronic device 100 to be described later can be basically applied. Thus, detailed description thereof will not be presented here.

According to the electronic device 200a, similarly to the electronic device 200, the area S1 of the second opening 242 of the hole portion 240, the area S2 of the first opening 272 of the communication hole 270, the area S3 of the third opening 274 of the communication hole 270, and the area S4 of the bottom face 241 of the hole portion 240 have the relation of "S2<S3<S4<S1". Accordingly, when the cavity 232 is sealed by melting the sealing member that is disposed in the hole portion 240, it can be suppressed that apart of the sealing member scatters inside the cavity 232 and is attached to the functional element 102. As a result, the electronic device 200a can have excellent characteristics.

In addition, in the electronic device 200a, the area S3 of the third opening 274 of the communication hole 270 is formed to be extremely small (for example, an area of 16 μm$^2$). In the case of such a small area, there is no concern that a part of the sealing member scatters, and accordingly, the third opening 274 can be arranged in the center portion of the lid body 220. In such a case, the resistance to a thermal stress is improved.

In addition, in the electronic device 200a, the cavity 232 is filled with inert gas (more specifically, nitrogen gas). For example, in a case where an acceleration sensor is used as the functional element 102, it is preferable that the cavity 232 is in the state of atmospheric pressure. The reason for this is that, in the case of an acceleration sensor, the viscosity of the inert gas significantly contributes to the sensitivity characteristics as a damping effect.

Third Embodiment

Figure 9:
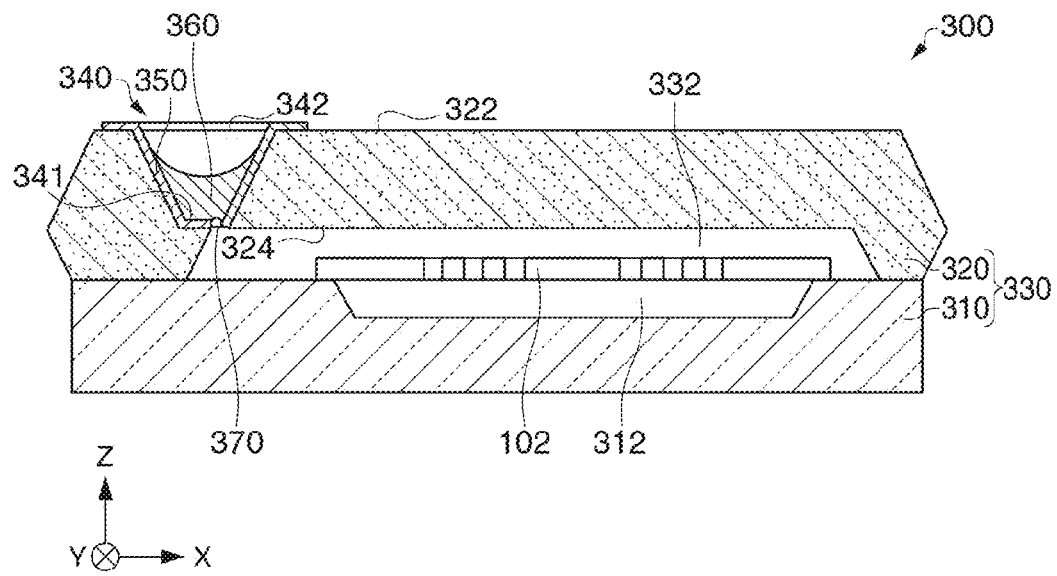
FIG. 9 is a cross-sectional view that schematically illustrates an electronic device according to a third embodiment.
Figure 10:
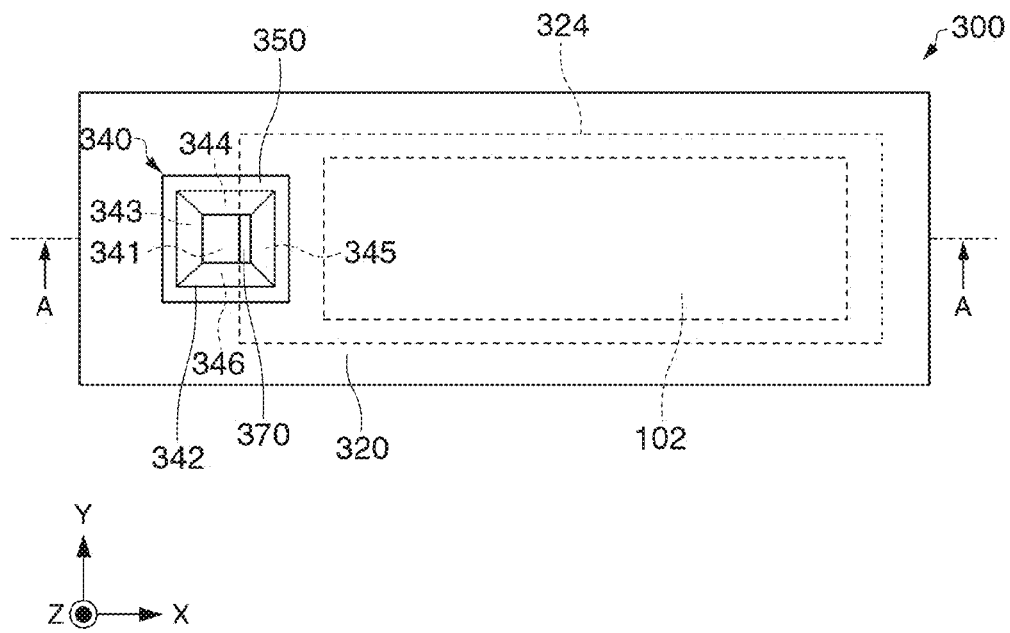
FIG. 10 is a plan view that schematically illustrates the electronic device according to the third embodiment.
Figure 11:
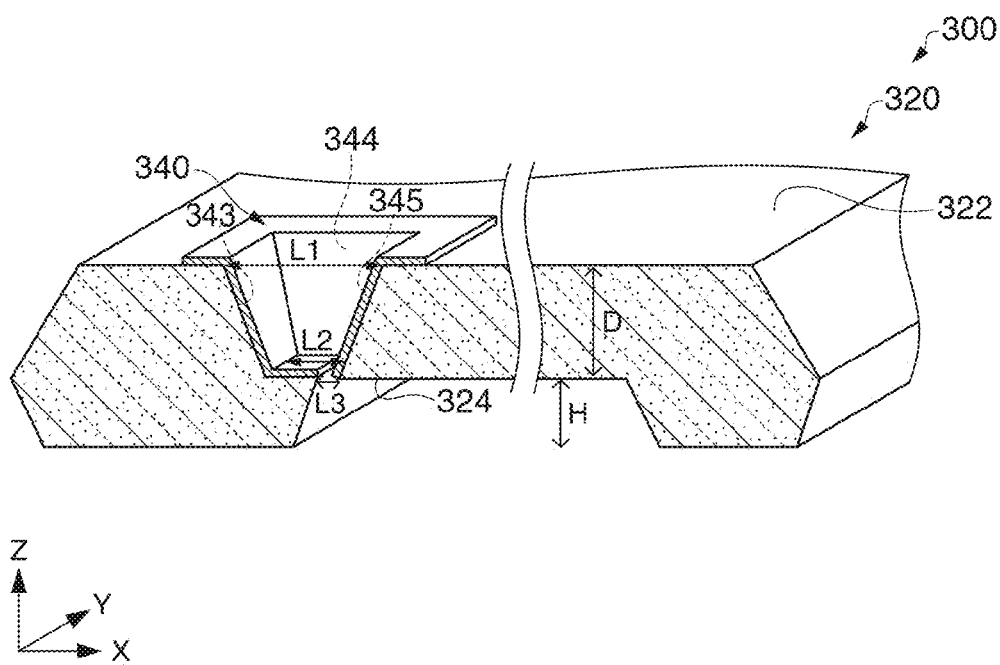
FIG. 11 is a cross-sectional perspective view that schematically illustrates a lid body of the electronic device according to the third embodiment.

Next, an electronic device according to a third embodiment will be described with reference to the drawings. FIG. 9 is a cross-sectional view that schematically illustrates the electronic device 300 according to the third embodiment. FIG. 10 is a plan view that schematically illustrates the electronic device 300 according to the third embodiment. FIG. 11 is a cross-sectional perspective view that schematically illustrates the electronic device 300 according to the third embodiment. FIG. 9 is a cross-sectional view taken along line A-A shown in FIG. 10, and FIG. 11 is a cross-sectional perspective view taken along line A-A shown in FIG. 10. For the convenience of description, in FIGS. 9 to 11, the X axis, the Y axis, and the Z axis are represented as three axes that are perpendicular to one another.

The electronic device 300, as shown in FIGS. 9 to 11, includes a package 330 that includes a base body 310 and a lid body 320, a sealing member 360, and a functional element 102. The electronic device 300 may further include a metal layer (conductive layer) 350. For the convenience of description, the functional element 102 is illustrated in a simplified manner in FIGS. 9 and 10. In addition, in FIGS. 10 and 11, the sealing member 360 is not illustrated. Furthermore, in FIG. 11, members other than the lid body 320 are not illustrated.

As the base body 310, for example, a glass substrate, a silicon substrate, a quartz crystal substrate may be used. The base body 310 supports the functional element 102. More specifically, in the base body 310, a concave portion 312 is formed, and the functional element 102 is arranged on the upper side of the concave portion 312. Owing to the concave portion 312, the functional element 102 can be moved only in a predetermined direction without intervening with the base body 310.

The lid body 320 is placed on the base body 310. The lid body 320 may be bonded to the base body 310. In some cases, the lid body 320 may be bonded to a part of the functional element 102. As the lid body 320, a silicon substrate (a substrate formed from silicon) is used. In a case where a glass substrate is used as the base body 310, the base body 310 and the lid body 320 may be bonded to each other through anodic bonding.

In addition, the method of bonding the base body 310 and the lid body 320 is not particularly limited but, for example, may be a bonding method using an adhesive such as low-melting point glass (glass paste) or a bonding method using soldering. Alternatively, the base body 310 and the lid body 320 may be bonded to each other by forming metal thin films (not shown in the figure) in bonding portions of the base body 310 and the lid body 320 and heating the metal thin films to be bonded to each other through eutectic bonding.

The base body 310 and the lid body 320 form a cavity 332 that houses the functional element 102. In the illustrated example, a concave portion is formed on the first face 324 side of the lid body 320, and the concave portion is sealed by the base body 310 so as to be formed as the cavity 332. The planar shape of the base body 310 and the lid body 320 (the shape viewed in the Z-axis direction) is not particularly limited, as long as the functional element 102 can be housed in the cavity 332. The planar shape of the base body 310 and the lid body 320, for example, is a rectangle (more particularly, an oblong).

The cavity 332 is sealed to be in a decompressed state or at the atmosphere of inert gas (for example, nitrogen gas). Particularly, in a case where a vibration-type gyro sensor is used as the functional element 102, it is preferable that the cavity 332 is in the decompressed state. In such a case, the attenuation of the vibration phenomenon of the vibration-type gyro sensor due to the air viscosity can be suppressed.

In addition, in the example shown in the figure, although the concave portion that becomes the cavity 332 is formed in the lid body 320, it may be formed in the base body 310, and the cavity 332 may be formed by sealing the concave portion formed in the base body 310 with the lid body 320.

On a second face 322 of the lid body 320, a hole portion 340 is formed. The hole portion 340 includes a second opening 342 that is disposed in the second face 322 of the lid body 320. The second face 322 of the lid body 320 is the front face of the lid body 320 and is a face that forms the outer shape of the package 330. The second face 322 of the lid body 320 is a face that is disposed on a side opposite to the first face 324 of the lid body 320. The first face 324 of the lid body 320 is a face that defines the cavity 332 (the bottom of the concave portion of the lid body 320 that becomes the cavity). The hole portion 340 has such a shape that the cross-sectional area (an area in the XY plane) gradually increases from the bottom face 341 toward the second opening 342. In other words, the area of the second opening 342 is larger than that of the bottom face 341.

The hole portion 340 communicates with the cavity 332 through a first opening 370 that is formed in a part of the bottom face 341 of the hole portion 340. The bottom face 341 of the hole portion 340 may be regarded as a face of the lid body 320 that defines the bottom of the hole portion 340. The bottom face 341 of the hole portion 340, for example, is flat. In the example shown in the figure, the bottom face 341 of the hole portion 340 is parallel to the second face 322 of the lid body 320. The first opening 370 is disposed in the first face 324 on the cavity 332 side. The area of the first opening 370 is smaller than the area of the second opening 342 of the hole portion 340. The first opening 370, as shown in FIG. 10, is formed in a portion in which the bottom face 341 of the hole portion 340 and the first face 324 of the lid body 320 overlap each other in the plan view. Furthermore, the first opening 370 is arranged at a position not overlapping the functional element 102 in the plan view. In other words, the first opening 370 is arranged on the outer side of the outer edge of the functional element 102.

The shape of the second opening 342 of the hole portion 340, as shown in FIG. 10, is a polygon. In the example shown in the figure, the shape of the second opening 342 is a rectangle (more specifically, a square). The shape of the bottom face 341 of the hole portion 340, for example, is a polygon and, in the example shown in the figure, similarly to the second opening 342, is a rectangle (more specifically, a square). The shape of the first opening 370, for example, is a polygon. The shape of the first opening 370, for example, is different from that of the second opening 342. In the example shown in the figure, the shape of the first opening 370 is a rectangle having a long side extending along the Y axis, and the shape of the second opening 342 is a square.

The side face (the face of the lid body 320 that defines the side face of the hole portion 340) of the hole portion 340, for example, is configured by four flat faces 343, 344, 345, and 346. In a case where the hole portion 340 is formed by performing wet-etching of the lid body 320 that is formed by a silicon substrate of plane (100), the flat faces 343, 344, 345, and 346 are a plane (111). In such a case, the flat faces 343, 344, 345, and 346 are formed so as to be inclined with respect to the first face 324 of the lid body 320 by a predetermined angle (about 54.7°).

As shown in FIG. 11, a length L1 of the second opening 342 of the hole portion 340 along the X axis, a length L2 of the bottom face 341 of the hole portion 340 along the X axis, and a length L3 of the first opening 370 along the X axis have the relation of "L3<L2<L1". The length L1 of the second opening 342 of the hole portion 340 along the X axis, for example, is about 426 μm. In addition, the length L2 of the bottom face 341 of the hole portion 340 along the X axis, for example, is about 100 μm. The length L3 of the first opening 370 along the X axis, for example, is about 10 μm. In addition, a distance D between the second face 322 and the first face 324 of the lid body 320, for example, is about 230 μm. The depth (the depth of the concave portion of the lid body 320 that becomes the cavity) H of the cavity 332, for example, is about 50 μm.

The metal layer 350, as shown in FIGS. 9 and 11, is formed on the side face (the flat faces 343, 344, 345, and 346) and the bottom face 341 of the hole portion 340. As the metal layer 350, for example, a layer acquired by stacking a chromium layer and a gold layer in the mentioned order from the inner face side of the hole portion 340 may be used. By the metal layer 350, the adhesiveness between the side face (the flat faces 343, 344, 345, and 346) and the bottom face 341 of the hole portion 340 and the sealing member 360 can be improved. The thickness of the metal layer 350 is not particularly limited but, for example, is in the range of about 30 to 200 nm.

In addition, the material of the metal layer 350 may be appropriately changed in accordance with the material of the sealing member 360. In addition, although not shown in the figure, the metal layer 350 may be formed on the whole face of the lid body 320.

The sealing member 360 is arranged in the hole portion 340 and seals the cavity 332. The material of the sealing member 360 is an alloy such as AuGe, AuSi, AuSn, SnPb, PbAg, SnAgCu, or SnZnBi.

The functional element 102 is placed (mounted) on the base body 310. The functional element 102 is placed (housed) in a cavity 332 that is formed (surrounded by the base body 310 and the lid body 320) by the base body 310 and the lid body 320. The functional element 102, for example, may be bonded to the base body 310 through anodic bonding or direct bonding or may be bonded using an adhesive. The form of the functional element 102 is not particularly limited, as long as the functional element 102 operates inside the closed cavity 332 in the decompressed state or at the atmosphere of inert gas. Thus, for example, any of various functional elements such as a gyro sensor, an acceleration sensor, a vibrator, a surface acoustic wave (SAW) element, and a micro actuator may be used.

Modified Example of Third Embodiment

Figure 12:
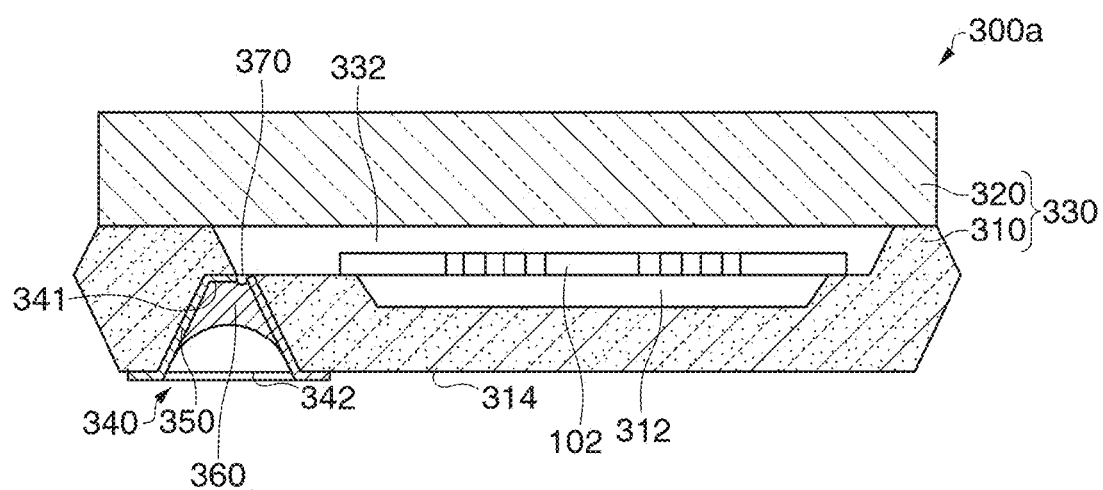
FIG. 12 is a cross-sectional view that schematically illustrates an electronic device according to a modified example of the third embodiment.

Next, an electronic device according to a modified example of the third embodiment will be described with reference to the drawings. FIG. 12 is a cross-sectional view that schematically illustrates the electronic device 300a according to the modified example of the third embodiment and corresponds to FIG. 9. Hereinafter, the same reference numeral is assigned to each member of the electronic device 300a according to the modified example of the third embodiment that has the same function as a constituent member of the electronic device 300 according to the third embodiment, and detailed description thereof will not be presented.

In the example of the electronic device 300, as shown in FIG. 9, the hole portion 340 is formed in the lid body 320. In contrast to this, in the electronic device 300a, as shown in FIG. 12, the hole portion 340 is formed in the base body 310.

In the electronic device 300a, a silicon substrate may be used as the base body 310. By using the silicon substrate as the base body 310, a processing technique used for manufacturing a silicon semiconductor device can be applied to forming the hole portion 340 in the base body 310. As a result, the hole portion 340 can be formed with fine and high precision. As the lid body 320, for example, a glass substrate, a silicon substrate, or a quartz crystal substrate may be used.

In the electronic device 300a, the second opening 342 of the hole portion 340 is disposed in a third face 314 of the base body 310. The third face 314 of the base body 310 is a front face of the base body 310 and is a face that forms the outer shape of the package 330. The bottom face 341 of the hole portion 340 may be regarded as a face of the base body 310 that defines the bottom of the hole portion 340. In addition, in the electronic device 300a, a concave portion that becomes the cavity 332 is formed in the base body 310.

As a method of manufacturing the electronic device 300a, a method of manufacturing the electronic device 100 to be described later can be basically applied. Thus, detailed description thereof will not be presented here.

According to the electronic device 300a, similarly to the electronic device 300, the hole portion 340 communicates with the cavity 332 through the first opening 370 that is disposed in a part of the bottom face 341 of the hole portion 340. Accordingly, when the cavity 332 is sealed by melting the sealing member 360 that is arranged in the hole portion 340, compared to a case where the hole portion 340 does not have the bottom face 341 (a case where the first opening is disposed in the entirety of the bottom face of the hole portion 340), it can be suppressed that a part of the sealing member 360 scatters inside the cavity 332 and is attached to the functional element 102. As a result, the electronic device 300a can have excellent characteristics.

Figure 13:
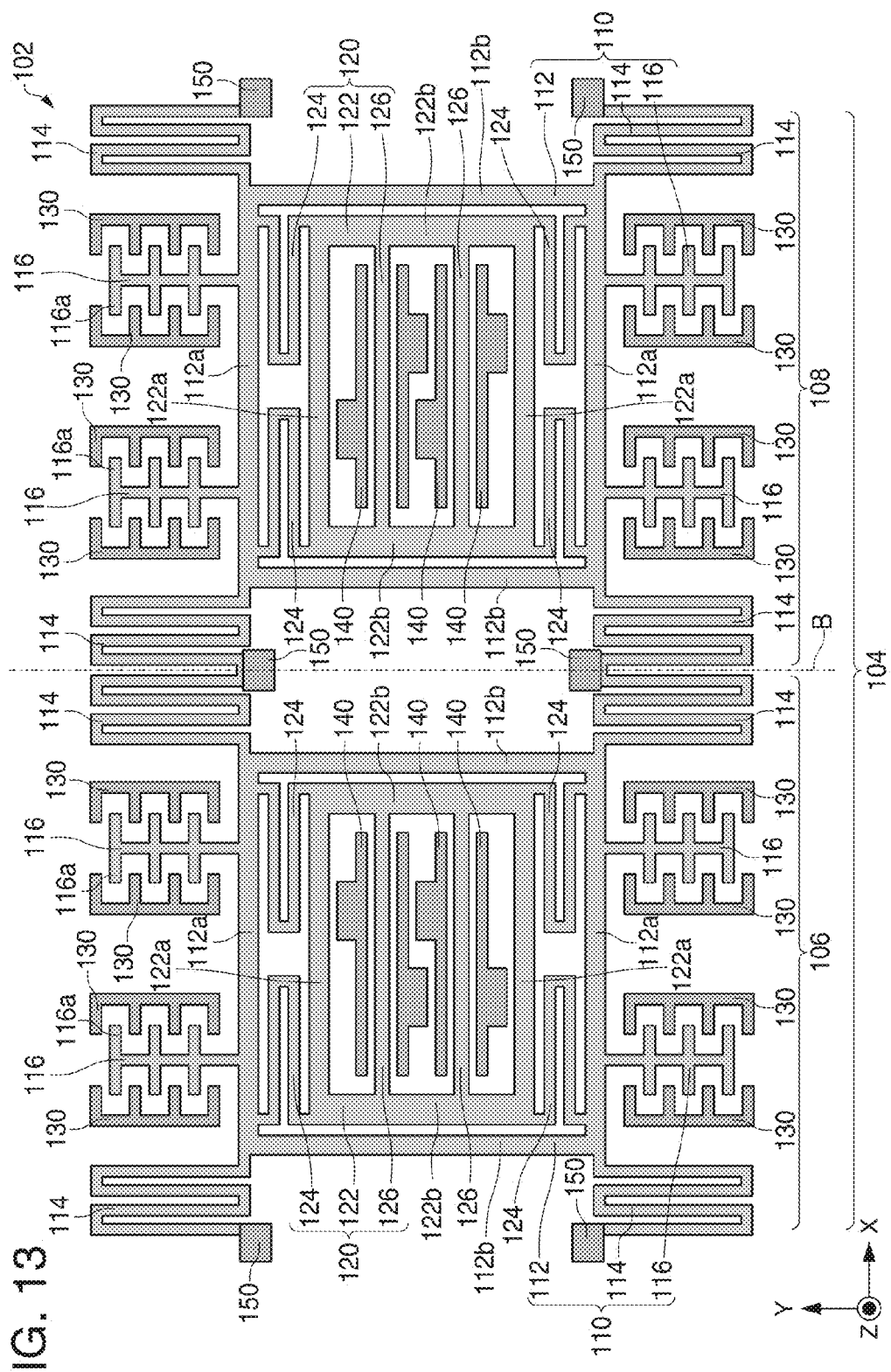
FIG. 13 is a plan view that schematically represents a functional element of the electronic device according to an embodiment.

Hereinafter, an example of the electronic device 100 will be described in which a gyro sensor is used as the functional element 102. FIG. 13 is a plan view that schematically shows the functional element 102 of any one of the electronic devices 100, 200, 200a, 300, and 300a according to the first to third embodiments and the modified examples thereof described above.

The functional element 102, as shown in FIG. 13, may include a vibration-system structure body 104, a driving fixed electrode 130, a detection fixed electrode 140, and a fixing unit 150.

The vibration-system structure body 104, for example, is integrally formed by processing a silicon substrate that is fixed to the base body 10. Accordingly, a fine processing technique that is used for manufacturing a silicon semiconductor device can be applied thereto, whereby the vibration-system structure body 104 can be miniaturized.

The vibration-system structure body 104 is supported by the fixing unit 150 that is fixed to the base body 10 (see FIG. 1) and is arranged so as to be separate from the base body 10. The vibration-system structure body 104 may include a first vibrator 106 and a second vibrator 108. The first vibrator 106 and the second vibrator 108 are connected to each other along the X-axis.

The first vibrator 106 and the second vibrator 108 may have a shape that is symmetrical to a boundary line B (a straight line extending in the Y axis) thereof. Accordingly, hereinafter, the configuration of the first vibrator 106 will be described, but the description of the configuration of the second vibrator 108 will not be presented.

The first vibrator 106 includes a driving portion 110 and a detection portion 120. The driving portion 110 may include a driving supporting portion 112, a driving spring portion 114, and a driving movable electrode 116.

The driving supporting portion 112, for example, has a frame shape and the detection portion 120 is arranged on the inner side of the driving supporting portion 112. In the example shown in the figure, the driving supporting portion 112 is configured by a first extending portion 112a that extends along the X axis and a second extending portion 112b that extends along the Y axis.

The driving spring portion 114 is arranged on the outer side of the driving supporting portion 112. In the example shown in the figure, one end of the driving spring portion 114 is connected to a place near the corner portion (a connection portion between a first extending portion 112a and the second extending portion 112b) of the driving supporting portion 112. The other end of the driving spring portion 114 is connected to the fixing portion 150.

In the example shown in the figure, four driving spring portions 114 are disposed in the first vibrator 106. Accordingly, the first vibrator 106 is supported by four fixing unit 150. In addition, the fixing unit 150 that is disposed on the boundary line B between the first vibrator 106 and the second vibrator 108 may not be arranged.

The driving spring portion 114 has a shape extending along the X axis while reciprocating along the Y axis. A plurality of the driving spring portions 114 are disposed so as to be symmetrical with respect to a virtual line that passes through the center of the driving supporting portion 112 along the X axis and a virtual line that passes through the center of the driving supporting portion 112 along the Y axis. By forming the driving spring portion 114 to have the above-described shape, the deformation of the driving spring portion 114 in the Y axis direction and the Z axis direction is suppressed, and accordingly, the driving spring portion 114 can be smoothly expanded or contracted along the X axis direction that is the vibration direction of the driving portion 110. In addition, the driving supporting portion 112 (the driving portion 110) can be vibrated along the X axis in accordance with the expansion or contraction of the driving spring portion 114. In addition, the number of the driving spring portions 114 is not particularly limited, as long as the driving supporting portion 112 can be vibrated along the X axis.

The driving movable electrode 116 is arranged on the outer side of the driving supporting portion 112 so as to be connected to the driving supporting portion 112. More specifically, the driving movable electrode 116 is connected to the first extending portion 112a of the driving supporting portion 112.

The driving fixed electrode 130 is arranged on the outer side of the driving supporting portion 112. The driving fixed electrode 130 is fixed to the upper side of the base body 10 (see FIG. 1). In the example shown in the figure, a plurality of the driving fixed electrodes 130 are disposed and are arranged so as to face each other through the driving movable electrode 116. In the example shown in the figure, the driving fixed electrode 130 has a comb-teeth shape, and the driving movable electrode 116 has a protruded portion 116a that can be inserted between the comb teeth of the driving fixed electrode 130. By configuring a distance (gap) between the driving fixed electrode 130 and the protruded portion 116a to be small, an electrostatic force acting on the driving fixed electrode 130 and the driving movable electrode 116 can be formed to be large.

By applying a voltage to the driving fixed electrode 130 and the driving movable electrode 116, an electrostatic force between the driving fixed electrode 130 and the driving movable electrode 116 can be generated. Accordingly, the driving supporting portion 112 (the driving portion 110) can be vibrated along the X axis while expanding or contracting the driving spring portion 114 along the X axis.

In addition, in the example shown in the figure, although four driving movable electrodes 116 are disposed in the first vibrator 106, the number thereof is not particularly limited as long as the driving supporting portion 112 can be vibrated along the X axis. In addition, in the example shown in the figure, although the driving fixed electrodes 130 are arranged so as to face each other through the driving movable electrode 116, the driving fixed electrode 130 may be arranged on only one side of the driving movable electrode 116 as long as the driving supporting portion 112 can be vibrated along the X axis.

The detection portion 120 is connected to the driving portion 110. In the example shown in the figure, the detection portion 120 is arranged on the inner side of the driving supporting portion 112. The detection portion 120 may include a detecting supporting portion 122, a detecting spring portion 124, and a detecting movable electrode 126. In addition, although not shown in the figure, the detection portion 120 may be arranged on the outer side of the driving supporting portion 112 as along as the detection portion 120 is connected to the driving portion 110.

The detecting supporting portion 122, for example, has a frame shape. In the example shown in the figure, the detecting supporting portion 122 is configured by a third extending portion 122a that extends along the X axis and a fourth extending portion 122b that extends along the Y axis.

The detecting spring portion 124 is arranged on the outer side of the detecting supporting portion 122. The detecting spring portion 124 connects the detecting supporting portion 122 and the driving supporting portion 112 to each other. More specifically, one end of the detecting spring portion 124 is connected to a place near the corner portion (a connection portion of the third extending portion 122a and the fourth extending portion 122b) of the detecting supporting portion 122. The other end of the detecting spring portion 124 is connected to the first extending portion 112a of the driving supporting portion 112.

The detecting spring portion 124 has a shape extending in the Y axis while reciprocating along the X axis. In the example shown in the figure, four detecting spring portions 124 are disposed in the first vibrator 106. A plurality of the detecting spring portions 124 are disposed to be symmetrical with respect to a virtual line that passes through the center of the detecting supporting portion 122 along the X axis and a virtual line that passes through the center of the detecting supporting portion 122 along the Y axis. By configuring the detecting spring portion 124 to have the above-described shape, the deformation of the detecting spring portion 124 in the X axis direction or the Z axis direction is suppressed, whereby the detecting spring portion 124 can be smoothly expanded or contracted in the Y axis direction that is the vibration direction of the detection portion 120. In addition, the detecting supporting portion 122 (the detection portion 120) can be displaced along the Y axis in accordance with the expansion or the contraction of the detecting spring portion 124. Furthermore, the number of the detecting spring portions 124 is not particularly limited, as long as the detecting supporting portion 122 can be displayed along the Y axis.

The detecting movable electrode 126 is arranged on the inner side of the detecting supporting portion 122 so as to be connected to the detecting supporting portion 122. In the example shown in the figure, the detecting movable electrode 126 extends along the X axis and is connected to two fourth extending portions 122b of the detecting supporting portions 122.

The detecting fixed electrode 140 is arranged on the inner side of the detecting supporting portion 122. The detecting fixed electrode 140 is fixed to the upper side of the base body 10 (see FIG. 1). In the example shown in the figure, a plurality of the detecting fixed electrodes 140 are disposed and are arranged so as to face each other through the detecting movable electrode 126.

The numbers and the shapes of the detecting movable electrodes 126 and the detecting fixed electrodes 140 are not particularly limited as long as a change in electrostatic capacitance between the detecting movable electrode 126 and the detecting fixed electrode 140 can be detected.

Next, the operation of the functional element 102 will be described. FIGS. 14 to 17 are diagrams that illustrate the operations of the functional elements 102 of the electronic devices 100, 200, 200a, 300, and 300a according to the embodiments and the modified examples described above. For the convenience of description, portions of the functional element 102 are illustrated in FIGS. 14 to 17 in a simplified manner.

When a voltage is applied to the driving fixed electrode 130 and the driving movable electrode 116 by a power source not shown in the figure, an electrostatic force can be generated between the driving fixed electrode 130 and the driving movable electrode 116. Accordingly, as illustrated in FIGS. 14 and 15, the driving spring portion 114 can be expanded and contracted along the X axis, whereby the driving portion 110 can vibrate along the X axis.

More specifically, a first AC voltage is applied between the driving movable electrode 116 and the driving fixed electrode 130 of the first vibrator 106, and a second AC voltage that is out of phase by 180 degrees from the first AC voltage is applied between the driving movable electrode 116 and the driving fixed electrode 130 of the second vibrator 108. Accordingly, the first driving portion 110a of the first vibrator 106 and the second driving portion 110b of the second vibrator 108 can be allowed to vibrate with opposite phases at a predetermined frequency along the X axis. In other words, the first driving portion 110a and the second driving portion 110b that are connected to each other along the X axis perform first vibration in which the first driving portion 110a and the second driving portion 110b vibrate with opposite phases along the X axis.

Figure 14:
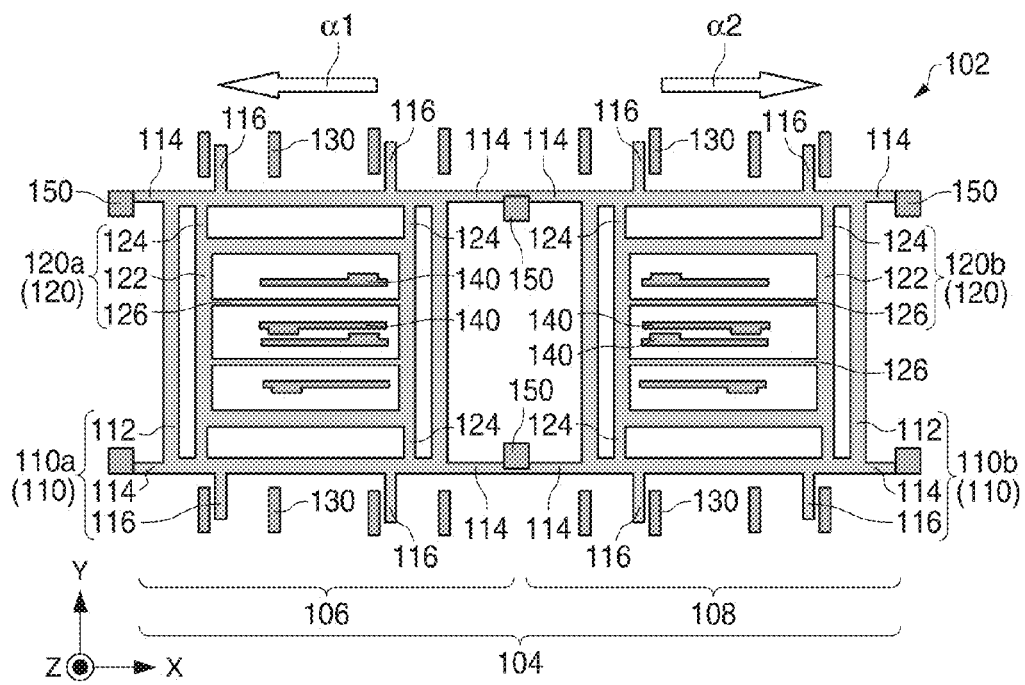
FIG. 14 is a diagram that illustrates the operation of a functional element of the electronic device according to an embodiment.
Figure 15:
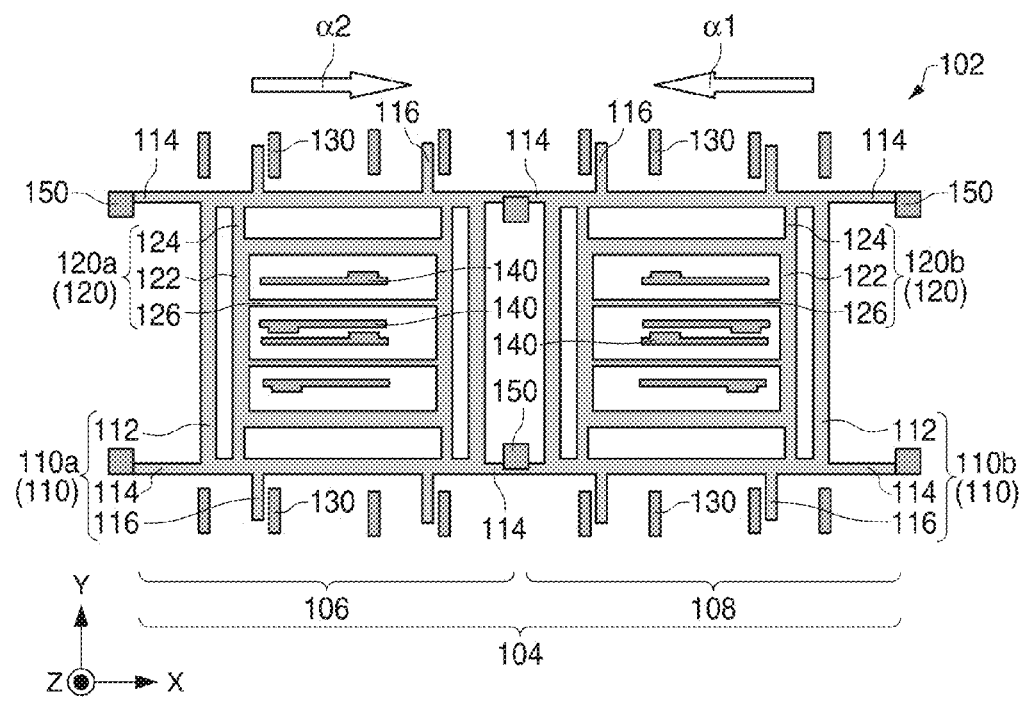
FIG. 15 is a diagram that illustrates the operation of a functional element of the electronic device according to an embodiment.

In the example shown in FIG. 14, the first driving portion 110a is displaced in a direction α1, and the second driving portion 110b is displaced in a direction α2 opposite to the direction α1. In the example shown in FIG. 15, the first driving portion 110a is displaced in the direction α2, and the second driving portion 110b is displaced in the direction α1.

In addition, since the detection portion 120 is connected to the driving portion 110, the detection portion 120 also vibrates along the X axis in accordance with the vibration of the driving portion 110. In other words, the first vibrator 106 and the second vibrator 108 are displaced in opposite directions along the X axis.

Figure 16:
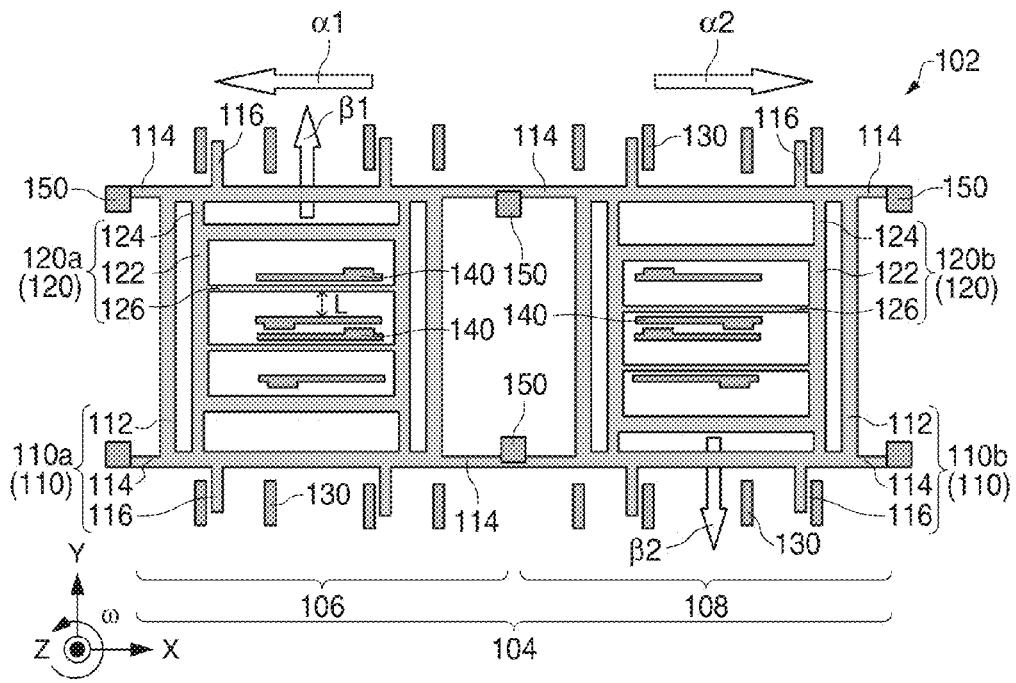
FIG. 16 is a diagram that illustrates the operation of a functional element of an electronic device according to an embodiment.
Figure 17:
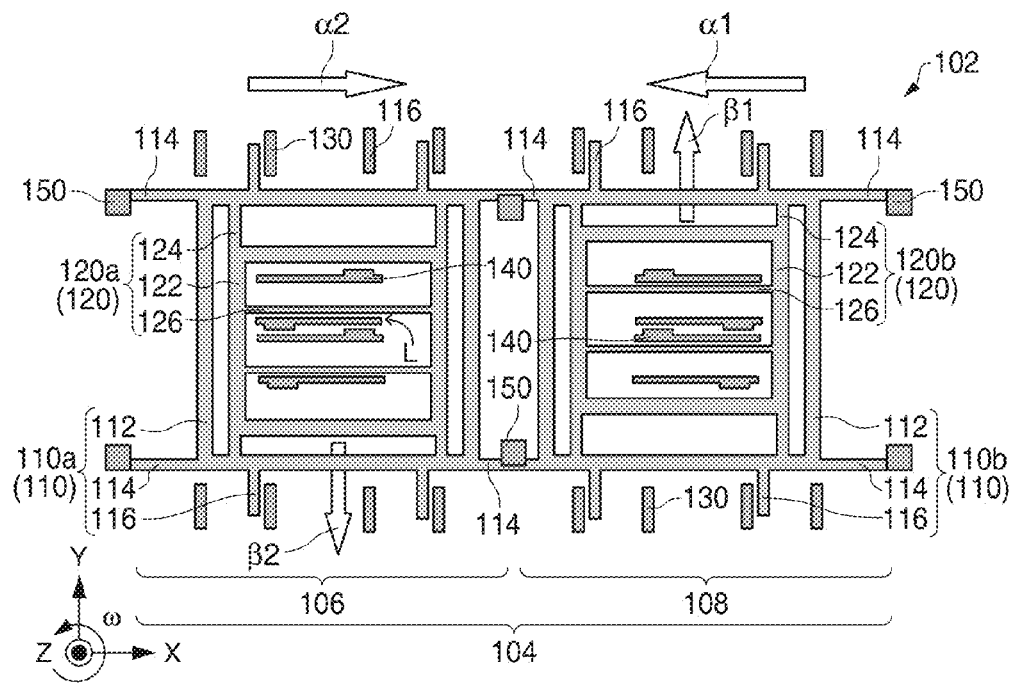
FIG. 17 is a diagram that illustrates the operation of a functional element of an electronic device according to an embodiment.

As shown in FIGS. 16 and 17, when angular velocity ω of Z axis rotation is added to the functional element 102 in a state in which the first driving portion 110a and the second driving portion 110b perform first vibration, a Coriolis force acts, whereby the detection portion 120 is displaced along the Y axis. In other words, the first detection portion 120a connected to the first driving portion 110a and the second detection portion 120b connected to the second driving portion 110b are displaced in opposite directions along the Y axis depending on the first vibration and the Coriolis force. In the example shown in FIG. 16, the first detection portion 120a is displaced in a direction β1, and the second detection portion 120b is displaced in a direction β2 that is a direction opposite to the direction β1. In the example shown in FIG. 17, the first detection portion 120a is displaced in the direction β2, and the second detection portion 120b is displaced in the direction β1.

As the first detection portion 120a and the second detection portion 120b are displaced along the Y axis, the distance L between the detecting movable electrode 126 and the detecting fixed electrode 140 changes. Accordingly, the electrostatic capacitance between the detecting movable electrode 126 and the detecting fixed electrode 140 changes. In the functional element 102, by applying voltages to the detecting movable electrode 126 and the detecting fixed electrode 140, the amount of change in electrostatic capacitance between the detecting movable electrode 126 and the detecting fixed electrode 140 is detected, and the angular velocity ω of the Z axis rotation can be acquired.

In addition, although a form (an electrostatic driving type) has been described in which the driving portion 110 is driven by an electrostatic force, the method of driving the driving portion 110 is not particularly limited, but a piezoelectric driving type or an electromagnetic driving type using a Lorentz force of a magnetic field can be applied.

The features of the electronic devices 100, 200, 200a, 300, and 300a according to the first to third embodiments and the modified examples described above will be described with reference to the electronic device 100 as an example. The electronic device 100 according to the above-described embodiment, for example, has the following features.

According to the electronic device 100, the ratio of the volume of the sealing member 60 to the volume of the hole portion 40 is equal to or higher than 35% and equal to or lower than 87%, and the ratio is more preferably to be equal to or higher than 35% and is equal to or lower than 58%. Accordingly, the hole portion 40 can be closed by using the sealing member 60, and the generation of crack in the lid body 20 on the circumference of the hole portion 40 can be suppressed. As a result, the electronic device 100 can have high reliability.

According to the electronic device 100, the shape of the first opening 41 can be formed as a polygon (more specifically, a rectangle). Accordingly, a gap 48 can be arranged between the sealing member 60a and the side face of the hole portion 40 (between the sealing member 60a and the metal layer 50) in the state in which the sphere-shaped sealing member 60a is arranged inside the hole portion 40 (see FIG. 22B). Therefore, the sealing member 60a can be suppressed from jumping out when the inside of the cavity 32 in which the functional element 102 is housed is formed to be in a decompressed state. For example, in a case where the gap 48 is not arranged in a state in which the sphere-shaped sealing member 60a is arranged inside the hole portion 40, there are cases where the sealing member 60a jumps out of the package 30 depending on a pressure difference between the inside and the outside of the package 30.

In addition, according to the electronic device 100, the corner portion of the second opening 42 is not filled with the sealing member 60. Accordingly, it is difficult for crack to be generated from the corner portion of the second opening 42, and the airtightness can be improved.

According to the electronic device 100, the first opening 41 and the functional element 102 do not overlap each other in the plan view. Accordingly, when the sphere-shaped sealing member 60a is melted by the emission of energy beams such as laser beams, even in a case where a part of the sealing member 60a scatters in the cavity 32, the scattered sealing member 60 can be suppressed from being attached to the functional element 102. In addition, when the energy beams pass through the sealing member 60a, there is no functional element 102 right below the hole portion 40, and accordingly, the functional element 102 can be prevented from being damaged.

In addition, according to the electronic device 100, the metal layer 50 is disposed on the side face of the hole portion 40, and the material of the sealing member 60 is an alloy that contains an element that is contained in the metal layer 50. Accordingly, when the sealing member 60a is melted, the melted sealing member 60a adheres along the side face of the hole portion 40, whereby the air-tightness can be improved.

According to the electronic device 100, the material of the base body 10 is glass, and the functional element 102 is a gyro sensor using silicon. Accordingly, the base body 10 and the functional element 102 and the base body 10 and the lid body 20 can be easily bonded to each other using anodic bonding. In addition, in a case where the gyro sensor is formed by the silicon MEMS processing, when the base body is formed from silicon, for example, the insulating film needs to be interposed so as to maintain an insulating property between the gyro sensor and the base body. However, by forming the base body 10 from glass, the insulating film does not need to be interposed, and insulating separation can be easily performed.

2. Method of Manufacturing Electronic Device

Next, a method of manufacturing the electronic devices according to the first to third embodiments and the modified examples described above will be described with reference to the drawings for the case of the electronic device 100 as an example. FIGS. 18 to 22B are cross-sectional views that schematically illustrate the manufacturing process of the electronic device 100 according to the first embodiment. In FIGS. 22A and 22B, in addition to the cross-sectional view (FIG. 22A), a plan view (FIG. 22B) that schematically illustrates the manufacturing process of the electronic device 100 is represented. For the convenience of description, in FIGS. 19, 21, 22A, and 22B, the functional element 102 is illustrated in a simplified manner.

Figure 18:
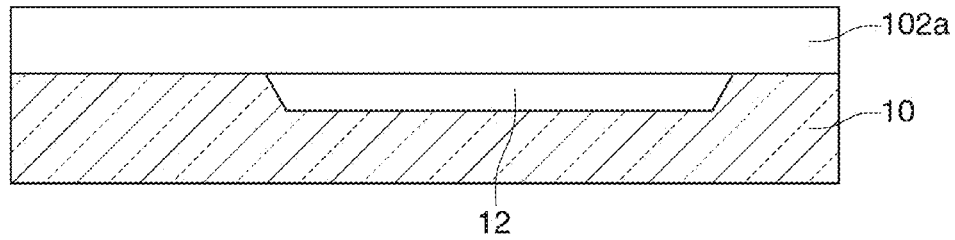
FIG. 18 is a cross-sectional view that schematically illustrates the manufacturing process of the electronic device according to the first embodiment.

As shown in FIG. 18, for example, a concave portion 12 is formed by patterning a glass substrate, whereby a base body 10 is acquired. Next, a silicon substrate 102a is bonded to the base body 10. As bonding between the base body 10 and the silicon substrate 102a, for example, anodic bonding is used.

Figure 19:
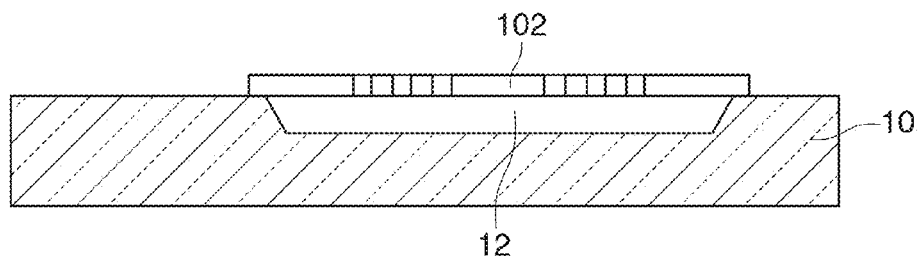
FIG. 19 is a cross-sectional view that schematically illustrates the manufacturing process of the electronic device according to the first embodiment.

In addition, as shown in FIG. 19, after the silicon substrate 102a is ground using a grinder so as to be formed as a thin film, the silicon substrate 102a is patterned in a desired shape so as to form a functional element 102. Accordingly, the functional element 102 can be placed (mounted) on the base body 10. The patterning is performed by using a photolithographic technique and an etching technique, and, as a more specific etching technique, a Bosch method can be used. Accordingly, fine processing can be performed, and the functional element 102 can be miniaturized.

Figure 20:
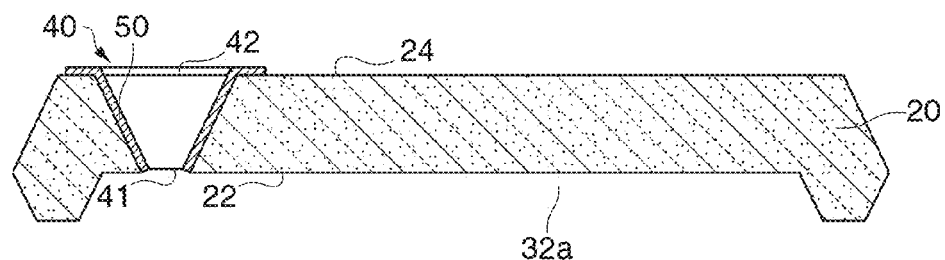
FIG. 20 is a cross-sectional view that schematically illustrates the manufacturing process of the electronic device according to the first embodiment.

As shown in FIG. 20, the silicon substrate is patterned, and a concave portion 32a that becomes a hole portion 40 and a cavity 32 is formed, whereby a lid body 20 is acquired. The patterning is performed using a photolithographic technique and an etching technique, and, as a more specific etching technique, wet etching can be used. The hole portion 40 is formed by performing wet etching from the second face 24 side, and the concave portion 32a is formed by performing wet etching from the first face 22 side. By performing the wet etching, the side face of the hole portion 40 can be formed as a flat face having a crystal plane of plane (111). In addition, the hole portion 40 can be formed such that the area of the second opening 42 is larger than the area of the first opening 41. In addition, the hole portion 40 and the concave portion 32a may be simultaneously formed or may be formed in processes different from each other.

Next, a metal layer 50 is formed on the side face of the hole portion 40. The metal layer 50, for example, is formed by forming a conductive layer (not shown in the figure) as a film by using a sputtering method and patterning the conductive layer.

Figure 21:
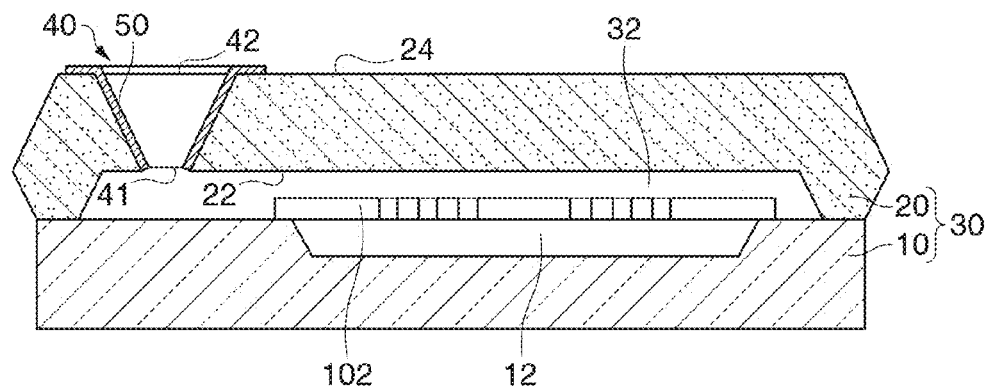
FIG. 21 is a cross-sectional view that schematically illustrates the manufacturing process of the electronic device according to the first embodiment.
Figure 22A:
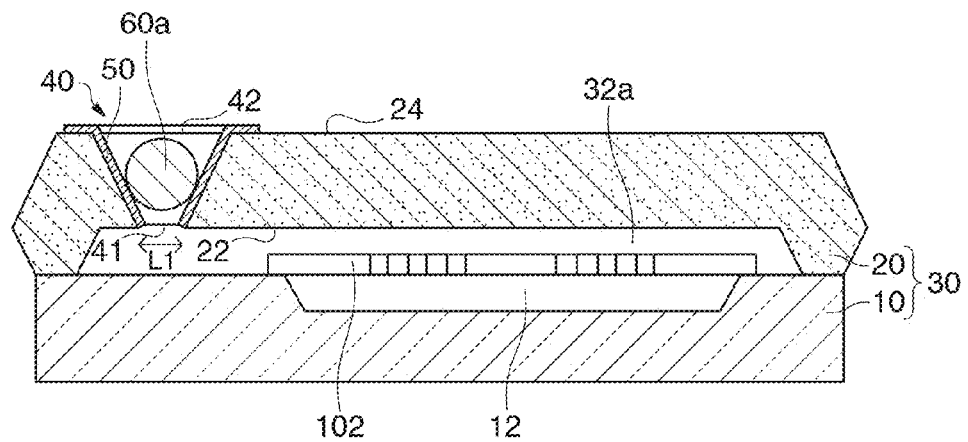
FIGS. 22A and 22B are a cross-sectional view and a plan view, respectively that schematically illustrate the manufacturing process of the electronic device according to the first embodiment.
Figure 22B:
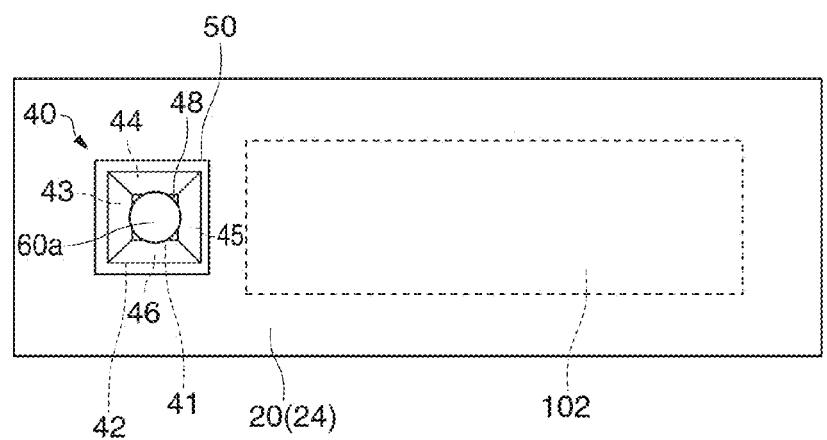

As shown in FIG. 21, the lid body 20 is placed on the base body 10, and the functional element 102 is housed in a cavity 32 that is formed by the base body 10 and the lid body 20. The lid body 20 may be bonded to the base body 10. Here, as bonding between the base body 10 and the lid body 20, for example, anodic bonding is used.

As shown in FIGS. 22A and 22B, a sphere-shaped sealing member 60a is arranged inside the hole portion 40. As the sealing member 60a, a sealing member having a diameter that is larger than the opening diameter L1 of the first opening 41 is used. Accordingly, the sealing member 60a is suppressed from being fallen inside the cavity 32. As the sealing member 60a, a sealing member having the ratio of the volume of the sealing member 60a to the volume of the hole portion 40 to be equal to or higher than 35% and equal to or lower than 87% is used, and, more preferably, a sealing member having the above-described ratio to be equal to or higher than 35% and equal to or lower than 58% is used.

Next, the sealing member 60a is melted through the emission of energy beams (for example, laser beams), whereby the hole portion 40 is closed (see FIG. 1). Accordingly, the cavity 32 can be sealed. The type of the laser beams is not particularly limited, and, for example, YAG laser beams may be used.

As shown in FIG. 22B, the first opening 41 and the functional element 102 are arranged at positions not overlapping each other in the plan view. Accordingly, when the sphere-shaped sealing member 60a is melted by the emission of laser beams, even in a case where a part of the sealing member 60a scatters in the cavity 32, the scattered sealing member 60a can be suppressed from being attached to the functional element 102. In addition, when the energy beams pass through the sealing member 60a, there is no functional element 102 right below the hole portion 40, and accordingly, the functional element 102 can be prevented from being damaged.

The sealing member 60a is melt, for example, after the cavity 32 (the atmosphere of the functional element 102 side) is decompressed (after vacuum drawing) through the hole portion 40. More specifically, laser beams are emitted inside a vacuum chamber so as to melt the sealing member 60a, whereby the hole portion 40 can be closed.

Alternatively, the sealing member 60a is melted, for example, in a state in which the cavity 32 is sealed with nitrogen through the hole portion 40. More specifically, nitrogen is introduced after the inside of the vacuum chamber is decompressed once, and laser beams are emitted so as to melt the sealing member 60a so as to close the hole portion 40, whereby nitrogen sealing can be performed.

As shown in FIG. 22B, the shape of the first opening 41 is a polygon (more specifically, a rectangle). Accordingly, a gap 48 can be arranged between the sealing member 60a and the side face of the hole portion 40 (between the sealing member 60a and the metal layer 50) in the state in which the sphere-shaped sealing member 60a is arranged inside the hole portion 40. Therefore, the sealing member 60a can be suppressed from jumping out when the inside of the cavity 32 is formed to be in a decompressed state. For example, in a case where the gap 48 is not arranged in a state in which the sphere-shaped sealing member 60a is arranged inside the hole portion 40, there are cases where the sealing member 60a jumps out of the package 30 depending on a pressure difference between the inside and the outside of the package 30.

Through the above-described process, the electronic device 100 can be manufactured.

The method of manufacturing the electronic device 100 according to the above-described embodiment, for example, has the following features.

According to the method of manufacturing the electronic device 100, as the sealing member 60a, a sealing member having the ratio of the volume of the sealing member 60a to the volume of the hole portion 40 to be equal to or higher than 35% and equal to or lower than 87% is used, and, more preferably, a sealing member having the above-described ratio to be equal to or higher than 35% and equal to or lower than 58% is used. Accordingly, the hole portion 40 can be closed by using the sealing member 60, and the generation of crack in the lid body 20 on the circumference of the hole portion 40 can be suppressed. As a result, the electronic device 100 can have high reliability.

According to the method of manufacturing the electronic device 100, the sealing member 60a can be melted while the cavity 32 is decompressed through the hole portion 40. Accordingly, the cavity 32 can be sealed in the decompressed state, and a decrease in the accuracy due to the attenuation of vibration of the functional element 102 (more specifically, the gyro sensor) that is caused by the air viscosity can be suppressed.

3. Experimental Example

Hereinafter, an embodiment of the present invention will be described more specifically by representing experimental examples. However, an embodiment of the invention is not limited at all by the following experimental example.

In the experimental example, a lid body (for example, see FIG. 3) as below is formed.

A concave portion that becomes a cavity was formed by processing a silicon substrate (100) having a thickness of 280 μm through a wet etching process. The depth H of the concave portion was 50 μm.

Next, a hole portion was formed so as to communicate with the cavity. The hole portion was processed by a wet etching process. Accordingly, a flat face having a crystal plane of plane (111) was formed as the side face of the hole portion. In addition, the opening diameter L1 of the first opening (opening arranged on the cavity side) of the hole portion was configured to be 100 μm, and the opening diameter L2 of the second opening (an opening arranged on a side opposite to the first opening) of the hole portion was configured to be 426 μm. Next, a chromium layer and a gold layer were formed as films in the mentioned order, and a metal layer was formed on the side face of the hole portion. At this time, the thickness of the chromium layer was in the range of 10 nm to 50 nm, and the thickness of the gold layer was in the range of 50 nm to 100 nm.

Next, a sphere-shaped sealing member formed from AuGe was arranged in the hole portion of the above-described lid body, and the sealing member was melted through laser emission so as to close the hole portion. In the process of closing the hole portion, the diameter (a diameter 170 μm to 360 μm at the center) of the sealing member and the intensity of laser beams were changed. In addition, the reason for using AuGe as the material of the sealing member is to increase the adhesiveness to the metal layer on the side face of the hole portion. Any other material such as AuSi or AuSn may be used as the material of the sealing member.

Table 1 represents the states of the hole portion and the lid body disposed on the circumference thereof with respect to the diameter of the sealing member. The states of the hole portion and the lid body disposed on the circumference thereof ware determined through microscopy. In Table 1, in a field of "Diameter", a designed value and an error of the diameter of the sealing member are represented. In addition, "Volume Ratio" represents a ratio of the volume of the sealing member to the volume of the hole portion. In Table 1, "go-through" represents a state in which a hole portion is not filled. In addition, "crack" represents a state in which crack is generated in the lid body on the circumference of the hole portion. "o" represents a state in which the hole portion is filled with the sealing member, and crack is not generated in the lid body on the circumference of the hole portion.

Comparative Example 2 (a diameter of 350 μm at the center) is used. For the convenience of description, in FIGS. 23 to 27, the metal layer is not shown.

Figure 23:
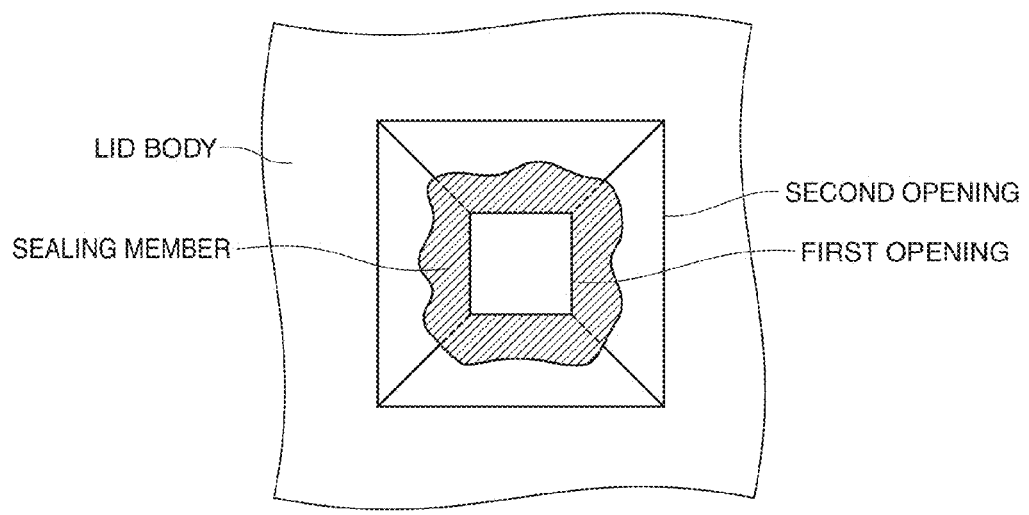
FIG. 23 is a plan view that schematically illustrates a lid body in a case where a sealing member of Comparative Example 1 is used.

In Comparative Example 1, as shown in FIG. 23, the sealing member was insufficient, and the first opening could not be filled. Most of the sealing member was welded in a scrambling state on the side face of the hole portion, and the first opening of the hole portion was in an open state.

Figure 24:
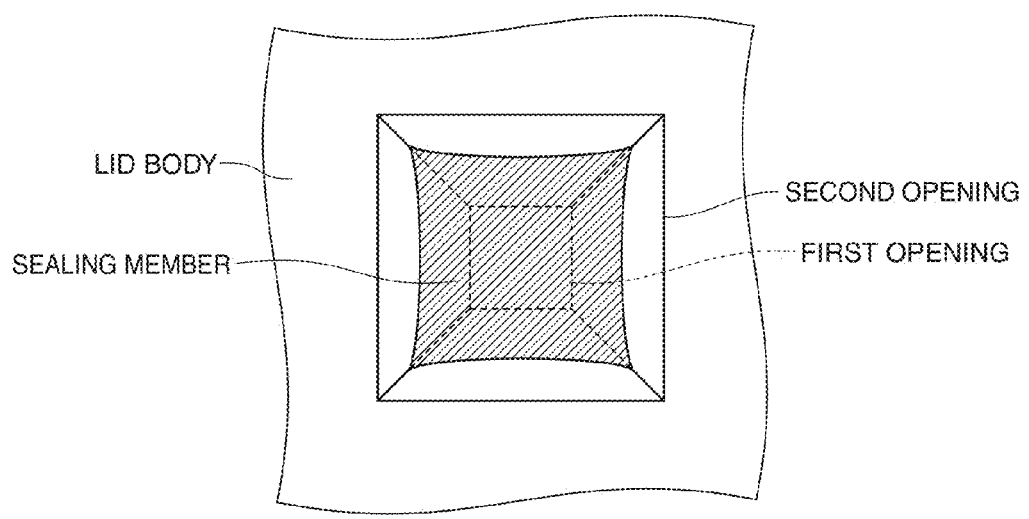
FIG. 24 is a plan view that schematically illustrates a lid body of a case where a sealing member according to Example 1 is used.

In Example 1, as shown in FIG. 24, it was checked that the first opening could be closed by the sealing member, and crack was not generated in the lid body disposed on the circumference of the hole portion.

TABLE 1

| Sealing Member | | Laser Power | | | | | | |
| --- | --- | --- | --- | --- | --- | --- | --- | --- |
| Diameter [μm] | Volume Ratio [%] | $I_0$ | $I_0 \times 1.25$ | $I_0 \times 1.5$ | $I_0 \times 2$ | $I_0 \times 2.25$ | $I_0 \times 2.5$ | $I_0 \times 3.5$ |
| 170 ± 20 | 10 to 20 | GO-THROUGH | GO-THROUGH | — | — | — | — | — |
| 250 ± 20 | 35 to 58 | — | O | O | O | O | — | — |
| 300 ± 10 | 71 to 87 | — | — | GO-THROUGH | GO-THROUGH | O | O | CRACK |
| 360 ± 10 | 125 to 148 | — | — | CRACK | CRACK | CRACK | CRACK | — |

As represented in Table 1, in Example 1 (a diameter of 250 μm at the center), the hole portion could be closed by the sealing member regardless of the intensity of laser beams, and the generation of crack in the lid body on the circumference of the hole portion could be suppressed. In Example 2 (a diameter of 300 μm at the center), by adjusting the intensity of laser beams to a desired condition, the hole portion could be closed by the sealing member, and the generation of crack in the lid body on the circumference of the hole portion could be suppressed. In other words, in a case where the ratio of the volume of the sealing member to the volume of the hole portion is equal to or higher than 35% and is equal to or lower than 87%, by adjusting the laser intensity to a desired condition, the generation of crack can be suppressed. In other words, it was acquired that the hole portion can be sealed by the sealing member, and the generation of crack in the lid body on the circumference of the hole portion can be suppressed by configuring the ratio of the volume of the sealing member to the volume of the hole portion to be equal to or higher than 35% and equal to or lower than 87%, more preferably, to be equal to or higher than 35% and equal to or lower than 58%.

Figure 25:
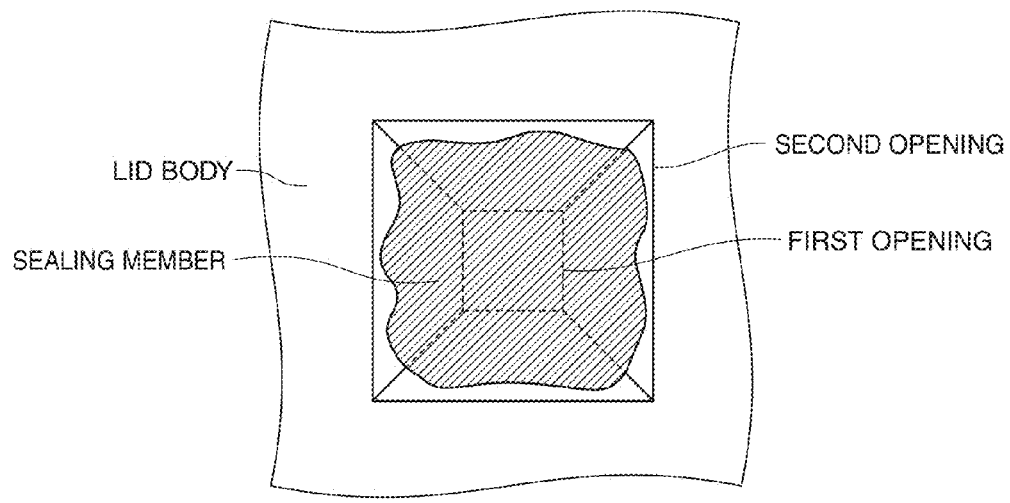
FIG. 25 is a plan view that schematically illustrates a lid body of a case where a sealing member according to Example 2 is used.
Figure 26:
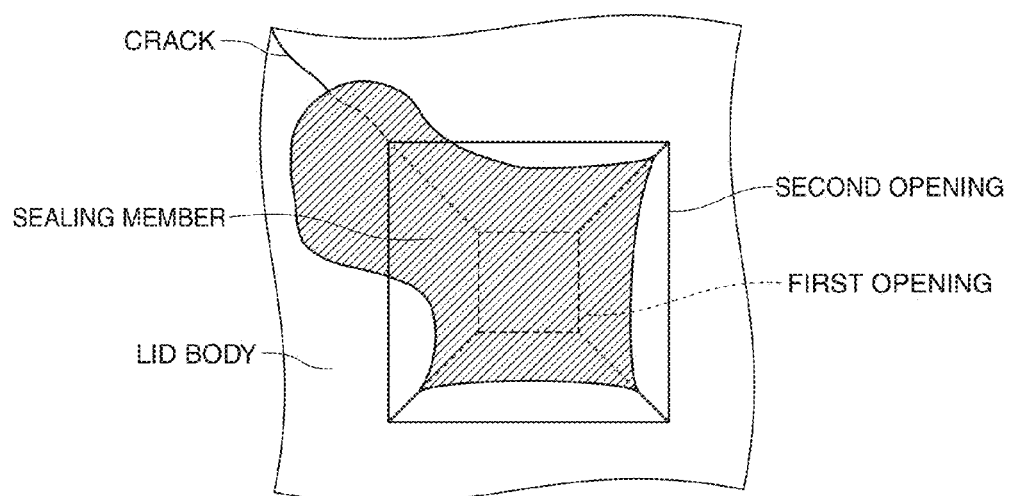
FIG. 26 is a plan view that schematically illustrates a lid body of a case where the sealing member according to Example 2 is used.
Figure 27:
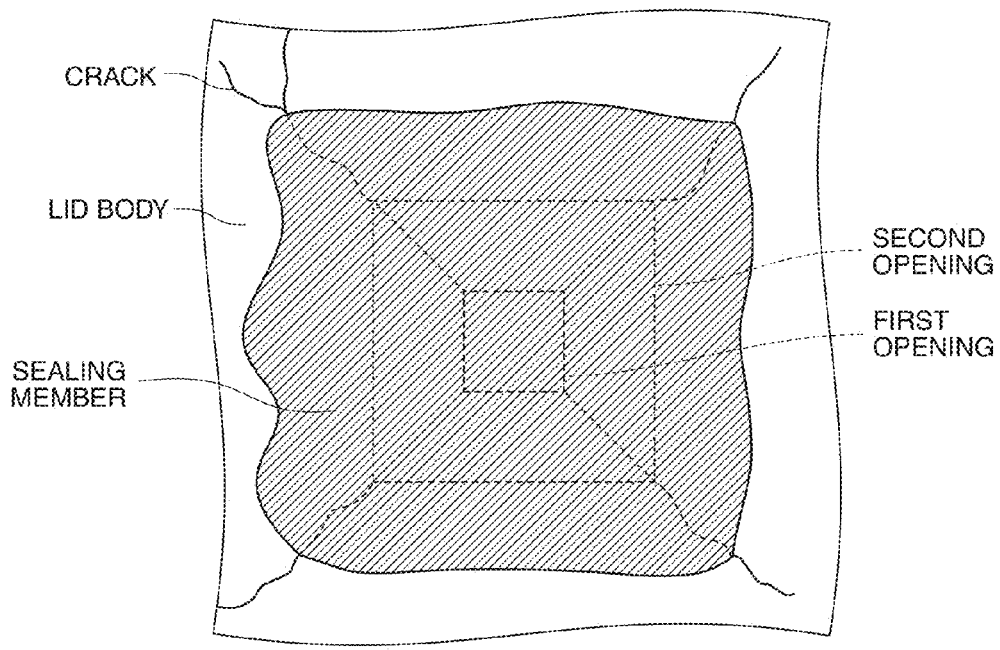
FIG. 27 is a plan view that schematically illustrates a lid body of a case where the sealing member according to Comparative Example 2 is used.

Here, FIG. 23 is a plan view that schematically illustrates the hole portion and the lid body disposed on the circumference thereof in a case where the sealing member of Comparative Example 1 (a diameter of 170 μm at the center) is used. In addition, FIG. 24 is a plan view that schematically illustrates the hole portion and the lid body disposed on the circumference thereof in a case where the sealing member of Example 1 (a diameter of 250 μm at the center) is used. FIG. 25 is a plan view that schematically illustrates the hole portion and the lid body disposed on the circumference thereof in a case where the sealing member of Example 2 (a diameter of 300 μm at the center) is used, and the laser intensity is $I_0 \times 2.5$. FIG. 26 is a plan view that schematically illustrates the hole portion and the lid body disposed on the circumference thereof in a case where the sealing member of Example 2 is used, and the laser intensity is $I_0 \times 3.5$. FIG. 27 is a plan view that schematically illustrates the hole portion and the lid body disposed on the circumference thereof in a case where the sealing member of In Example 2, as shown in FIG. 26, crack was generated in a part of the lid body in accordance with the intensity of the laser beams. Particularly, it was acquired that the sealing member spreads up to the apex of the corner portion of the second opening so as to generate crack in a case where the laser intensity was too strong. In Example 2, as shown in FIG. 25, it was understood that, by adjusting the laser intensity, the generation of crack can be suppressed.

In Comparative Example 2, as shown in FIG. 27, the sealing member extruded from the second opening, and crack is generated from the apex of the corner portion as a beginning point. The crack radially grows from the apex of the corner portion of the second opening in the lid body. In this Comparative Example 2, since the sealing member extrudes from four apexes of the corner portions of the second opening, the crack spreads from the four apexes of the corner portions in the lid body.

The reason for the generation of crack is thought to be the corner portions of the second opening, at which stress can be easily concentrated, filled (covered) with the sealing member. Especially, the boundary of the side faces of the hole portion is the same as the plane (110) of silicon and tends to easily be open. Accordingly, when the sealing member is melted at the apexes of the corner portions of the second opening and is thermally contracted, crack is thought to be generated from the corner portions as beginning points.

In the description presented above, although the sealing member is melted by laser beams, the beams are not limited thereto, and energy beams such as electron beams can be used.

4. Electronic Apparatus

Next, an electronic apparatus according to an embodiment will be described with reference to the drawings. The electronic apparatus according to this embodiment includes an electronic device according to an embodiment of the invention. Hereinafter, as an electronic device according to an embodiment of the invention, an electronic apparatus that includes the electronic device 100 will be described.

Figure 28:
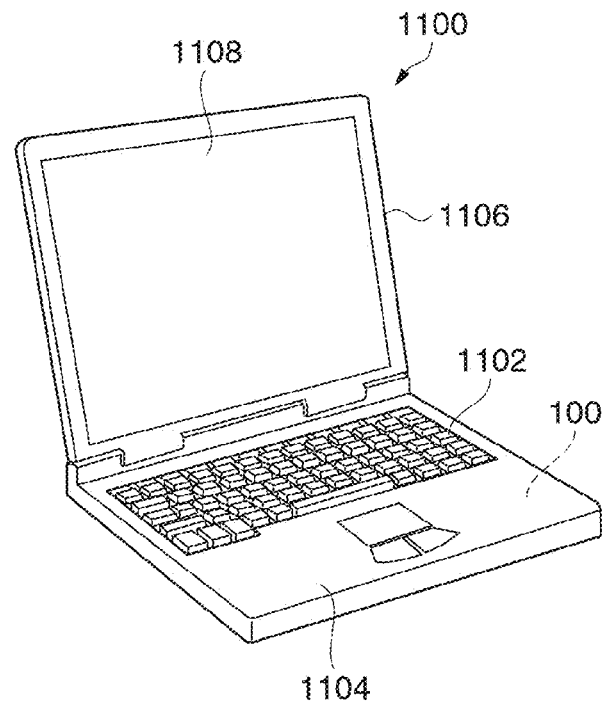
FIG. 28 is a perspective view that schematically illustrates an electronic apparatus according to an embodiment.

FIG. 28 is a perspective view that schematically illustrates a mobile-type (or notebook-type) personal computer 1100 as an electronic apparatus according to this embodiment.

As shown in FIG. 28, the personal computer 1100 is configured by a main body unit 1104 including a keyboard 1102 and a display unit 1106 including a display section 1108. The display unit 1106 is supported so as to be rotatable through a hinge structure portion with respect to the main body unit 1104.

The electronic device 100 is built in the personal computer 1100.

Figure 29:
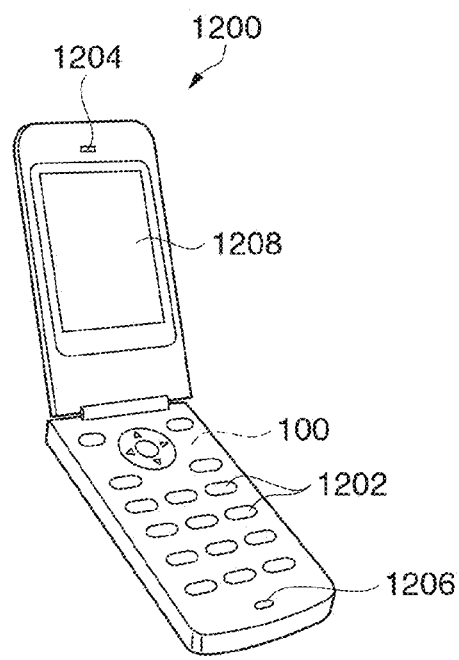
FIG. 29 is a perspective view that schematically illustrates an electronic apparatus according to an embodiment.

FIG. 29 is a perspective view that schematically illustrates a cellular phone (including a PHS) 1200 as an electronic apparatus according to this embodiment.

As shown in FIG. 29, the cellular phone 1200 includes a plurality of operation buttons 1202, an ear piece 1204, and a mouth piece 1206, and a display section 1208 is arranged between the operation buttons 1202 and the ear piece 1204.

The electronic device 100 is built in the cellular phone 1200.

Figure 30:
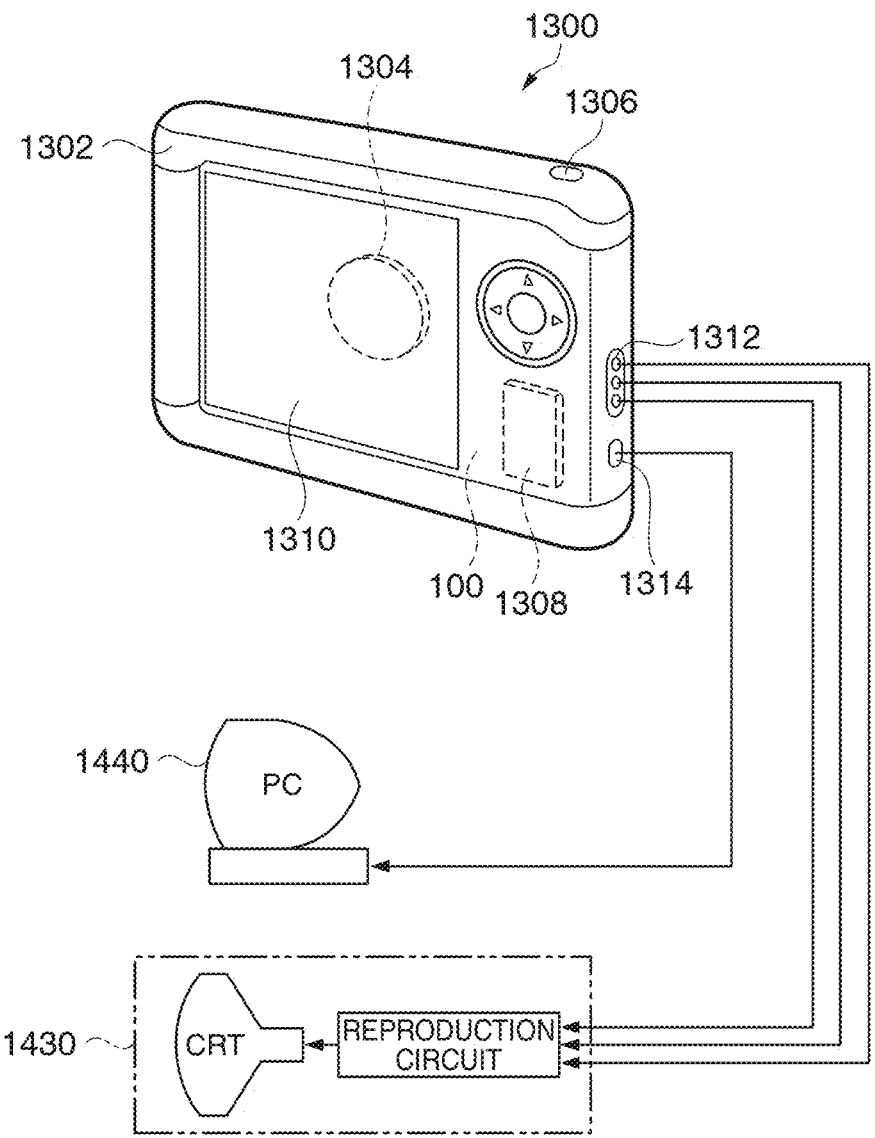
FIG. 30 is a perspective view that schematically illustrates an electronic apparatus according to an embodiment.

FIG. 30 is a perspective view that schematically illustrates a digital camera 1300 as an electronic apparatus according to an embodiment. In FIG. 30, a connection with external device is represented in a simplified manner.

Here, while an ordinary camera exposes a silver-halide photo film in accordance with the light image of a subject, the digital camera 1300 generates an imaging signal (image signal) by performing photoelectric conversion of the light image of a subject by using an imaging device such as a charge coupled device (CCD).

On the rear face of the case (body) 1302 of the digital camera 1300, a display section 1310 is disposed and configured such that the display is performed based on the imaging signal acquired by the CCD. The display section 1310 serves as a finder that displays a subject as an electronic image.

In addition, on the front face side (the rear face side in the figure) of the case 1302, a light receiving unit 1304 that includes an optical lens (imaging optical system), a CCD, and the like is disposed.

When a photographer checks a subject image displayed on the display section 1310 and presses a shutter button 1306, an imaging signal of the CCD at that time point is transmitted to the memory 1308 and is stored therein.

In addition, in this digital camera 1300, on the side face of the case 1302, a video signal output terminal 1312 and a data communication input-output terminal 1314 are disposed. A television monitor 1430 is connected to the video signal output terminal 1312, and the personal computer 1440 is connected to the data communication input-output terminal 1314, as is necessary. In addition, it is configured such that an imaging signal stored in the memory 1308 is output to a television monitor 1430 or a personal computer 1440 in accordance with a predetermined operation.

In the digital camera 1300, the electronic device 100 is built.

The above-described electronic apparatuses (the personal computer 1100, the cellular phone 1200, and the digital camera 1300) includes the electronic device 100 having high reliability. Accordingly, the electronic apparatuses (the personal computer 1100, the cellular phone 1200, and the digital camera 1300) have high reliability.

In addition, the electronic apparatus that includes the above-described electronic device 100, for example, can be applied to an ink jet ejecting apparatus (for example, an ink jet printer), a lap top personal computer, a television set, a video camera, a video tape recorder, various navigation apparatuses, a pager, an electronic organizer (including a type that includes a communication function), an electronic dictionary, a calculator, an electronic game device, a word processor, a workstation, a television phone, a security television monitor, an electronic binocular telescope, a POS terminal, an medical apparatus (for example, an electronic thermometer, a sphygmomanometer, a blood glucose monitoring system, an electrocardiogram measurement device, an ultrasonic diagnosis device, or an electronic endoscope), a fish-finder, various measurement apparatuses, meters (for example, meters of vehicles, airplanes, or ships), a flight simulator, and the like, in addition to the personal computer (mobile-type personal computer) 1100 shown in FIG. 28, the cellular phone 1200 shown in FIG. 29, and the digital camera 1300 shown in FIG. 30.

The above-described embodiments and the modified examples are examples, and an embodiment of the invention is not limited thereto. For example, the embodiments and the modified examples can be appropriately combined.

The invention includes the substantially the same configuration as the configuration explained in the embodiment (for example, a configuration having the same function, the same method, and the same result or a configuration having the same object and the same advantages). In addition, the invention includes a configuration in which a part of the embodiment that is not essential is replaced. Furthermore, the invention includes a configuration having the same operation and advantages as those of the configuration described in the embodiment and a configuration that can achieve the same object. In addition, the invention includes a configuration in which known technique are added to the configuration described in the embodiment.

The entire disclosure of Japanese Patent Application Nos: 2011-207262, filed Sep. 22, 2011, 2011-244467, filed Nov. 8, 2011 and 2011-244468, filed Nov. 8, 2011 are expressly incorporated by reference herein.

What is claimed is:

1. An electronic device comprising:
   a base body;
   a functional element that is placed on the base body;
   a lid body, formed from silicon, that is placed over the base body so as to cover the functional element; and
   a cavity that houses the functional element, wherein the cavity is surrounded by the base body and the lid body,
   wherein a hole portion and a sealing member that closes the hole portion are disposed in the lid body,
   wherein, in the hole portion, the area of a second opening disposed on a side opposite to a first opening is larger than the area of the first opening disposed on the base body side, and
   wherein a ratio of a volume of the sealing member to a volume of the hole portion is equal to or higher than 35% and is equal to or lower than 87%,
   wherein the hole portion includes a bottom face and communicates with the cavity through a communication hole that is disposed in a part of the bottom face, and
   wherein, when an opening area of the second opening of the hole portion is S1, an opening area of the first opening of the communication hole is S2, an opening area of the communication hole on the cavity side is S3, and the area of the bottom face of the hole portion is S4, relation of "S2<S3<S4<S1" is satisfied; wherein the bottom face of the hole portion is flat.

2. The electronic device according to claim 1,
   wherein the ratio of the volume of the sealing member to the volume of the hole portion is equal to or higher than 35% and is equal to or lower than 58%.

3. The electronic device according to claim 1,
   wherein a shape of the first opening is a polygon.

4. The electronic device according to claim 3,
wherein a corner portion of the second opening is not filled with the sealing member.

5. The electronic device according to claim 1,
wherein the functional element is arranged at a position not overlapping the first opening in a plan view.

6. The electronic device according to claim 1,
wherein a metal layer is disposed on a side face of the hole portion, and
wherein a material of the sealing member is an alloy that contains an element included in the metal layer.

7. The electronic device according to claim 1,
wherein the base body is formed from glass, and
wherein the functional element is a gyro sensor using silicon.

8. The electronic device according to Claim 1,
wherein a shape of the second opening of the hole portion, the first opening of the communication hole, and an opening of the communication hole on the cavity side is a polygon.

9. The electronic device according to Claim 1,
wherein the functional element is arranged so as not to overlap the opening of the communication hole on the cavity side in a plan view.

10. The electronic device according to claim 1,
wherein the lid body is placed in the base body and includes the hole portion disposed on one face side and a cavity disposed on the other face side,
wherein the functional element is housed in the cavity, and
wherein the hole portion includes a bottom face, includes the second opening that has a polygonal shape in a plan view, and communicates with the cavity through the first opening that is disposed in a part of the bottom face of the hole portion.

11. The electronic device according to claim 10,
wherein the bottom face of the hole portion is flat.

12. The electronic device according to claim 10,
wherein the area of the first opening is smaller than the area of the second opening.

13. The electronic device according to claim 10,
wherein the first opening does not overlap the functional element in a plan view.

14. A method of manufacturing an electronic device, the method comprising:
placing a functional element on a base body;
forming a hole portion in a lid body that is formed from silicon;
housing the functional element by placing the lid body on the base body;
arranging a sealing member in the hole portion; and
closing the hole portion by melting the sealing member with energy beams,
wherein, the hole portion is formed such that the area of a second opening disposed on a side opposite to a first opening is larger than the area of the first opening disposed on the base body side,
wherein a ratio of a volume of the sealing member to a volume of the hole portion is equal to or higher than 35% and is equal to or lower than 87%,
wherein a cavity houses the functional element, wherein the cavity is surrounded by the base body and the lid body, wherein the hole portion is a flat bottom face and communicates with the cavity through a communication hole that is disposed in a part of the flat bottom face; and
wherein, when an opening area of the second opening of the hole portion is $S1$, an opening area of the first opening of the communication hole is $S2$, an opening area of the communication hole on the cavity side is $S3$, and the area of the flat bottom face of the hole portion is $S4$, relation of "$S2 < S3 < S4 < S1$" is satisfied.

15. The method according to claim 14,
wherein, in the closing of the hole portion, the sealing member is melt after an atmosphere of the functional element side is decompressed through the hole portion.

16. An electronic apparatus comprising an electronic device according to claim 1.

* * * * *